US010861702B2

(12) United States Patent
Nguyen et al.

(10) Patent No.: US 10,861,702 B2
(45) Date of Patent: *Dec. 8, 2020

(54) CONTROLLED RESIDENCE CMP POLISHING METHOD

(71) Applicant: Rohm and Haas Electronic Materials CMP Holdings, Inc., Newark, DE (US)

(72) Inventors: John Vu Nguyen, Chadds Ford, PA (US); Tony Quan Tran, Bear, DE (US); Jeffrey James Hendron, Elkton, MD (US); Jeffrey Robert Stack, Clayton, DE (US)

(73) Assignee: Rohm and Haas Electronic Materials CMP Holdings, Newark, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/725,936

(22) Filed: Oct. 5, 2017

(65) Prior Publication Data

US 2018/0366332 A1   Dec. 20, 2018

Related U.S. Application Data

(63) Continuation-in-part of application No. 15/624,943, filed on Jun. 16, 2017, now abandoned, which is a
(Continued)

(51) Int. Cl.
*H01L 21/304* (2006.01)
*B24B 37/00* (2012.01)
(Continued)

(52) U.S. Cl.
CPC .......... *H01L 21/3043* (2013.01); *B24B 37/00* (2013.01); *B24B 37/26* (2013.01);
(Continued)

(58) Field of Classification Search
CPC ......... B24B 37/26; B24B 37/16; B23F 21/02; H01L 21/30625
(Continued)

(56) References Cited

U.S. PATENT DOCUMENTS 4,037,367 A    7/1977   Kruse
4,450,652 A *  5/1984   Walsh .................... B24B 49/14
                                             451/288
(Continued)

FOREIGN PATENT DOCUMENTS

CN    104227554       12/2014
CN    104227554 A     12/2014
(Continued)

OTHER PUBLICATIONS

Copending U.S. Appl. No. 15/725,836.
(Continued)

*Primary Examiner* — Orlando E Aviles
*Assistant Examiner* — Thomas Raymond Rodgers
(74) *Attorney, Agent, or Firm* — Blake T. Biederman

(57) ABSTRACT

The invention provides a method for polishing or planarizing a wafer of at least one of semiconductor, optical and magnetic substrates. The method includes rotating a polishing pad, the rotating polishing pad having radial feeder grooves in the polishing layer separating the polishing layer into polishing regions. The polishing regions are circular sectors defined by two adjacent radial feeder grooves. The radial feeder grooves extend from a location adjacent the center to a location adjacent the outer edge. Each polishing region includes a series of biased grooves connecting a pair of adjacent radial feeder grooves. Pressing and rotating the wafer against the rotating polishing pad for multiple rota-
(Continued)

tions of the polishing pad adjusts polishing by either increasing or decreasing residence time of the polishing fluid under the wafer.

8 Claims, 23 Drawing Sheets

Related U.S. Application Data continuation-in-part of application No. 15/623,204, filed on Jun. 14, 2017, now abandoned.

(51) Int. Cl.
*B24B 37/26* (2012.01)
*C09G 1/02* (2006.01)
*C09K 3/14* (2006.01)
*H01L 21/02* (2006.01)
*H01L 21/3105* (2006.01)
*H01L 21/321* (2006.01)
*H01L 21/67* (2006.01)

(52) U.S. Cl.
CPC .............. *C09G 1/02* (2013.01); *C09K 3/1409* (2013.01); *H01L 21/0203* (2013.01); *H01L 21/31053* (2013.01); *H01L 21/3212* (2013.01); *H01L 21/67017* (2013.01)

(58) Field of Classification Search
USPC .......................................................... 451/59
See application file for complete search history.

(56) References Cited

U.S. PATENT DOCUMENTS

| | | | |
|---|---|---|---|
| 4,918,872 A * | 4/1990 | Sato | B24B 37/26 451/450 |
| 5,076,024 A | 12/1991 | Akagawa et al. | |
| 5,212,910 A | 5/1993 | Breivogel et al. | |
| 5,243,790 A | 9/1993 | Gagne | |
| 5,527,215 A | 6/1996 | Rubino et al. | |
| 5,578,362 A | 11/1996 | Reinhardt et al. | |
| 5,690,540 A * | 11/1997 | Elliott | B24B 37/26 451/288 |
| 5,778,481 A | 7/1998 | Amsden et al. | |
| 5,888,121 A | 3/1999 | Kirchner et al. | |
| 6,120,366 A * | 9/2000 | Lin | B24B 37/26 451/41 |
| 6,135,856 A * | 10/2000 | Tjaden | B24B 37/26 451/288 |
| 6,220,942 B1 | 4/2001 | Tolles et al. | |
| 6,656,019 B1 | 12/2003 | Chen et al. | |
| 6,749,485 B1 | 6/2004 | James et al. | |
| 6,749,714 B1 | 6/2004 | Ishikawa et al. | |
| 6,783,436 B1 | 8/2004 | Muldowney | |
| 6,827,638 B2 * | 12/2004 | Kiuchi | B24B 37/015 451/287 |
| 6,843,711 B1 | 1/2005 | Muldowney | |
| 6,918,824 B2 | 7/2005 | Marquardt et al. | |
| 6,955,587 B2 | 10/2005 | Muldowney | |
| 7,021,995 B2 | 4/2006 | Toge et al. | |
| 7,140,955 B2 | 11/2006 | Nabeya | |
| 7,169,014 B2 * | 1/2007 | Taylor | B24B 37/26 451/285 |
| 7,169,029 B2 | 1/2007 | Petersen et al. | |
| 7,255,633 B2 | 8/2007 | Muldowney | |
| 7,329,174 B2 | 2/2008 | Hosaka et al. | |
| 7,357,703 B2 * | 4/2008 | Nishimura | B24B 37/26 451/526 |
| 7,364,497 B2 * | 4/2008 | Park | B24B 37/04 451/285 |
| 7,377,840 B2 | 5/2008 | Deopura et al. | |
| D584,591 S | 1/2009 | Tano et al. | |
| 7,534,162 B2 | 5/2009 | Bottema et al. | |
| 7,662,028 B2 * | 2/2010 | Feng | B24B 37/26 451/526 |
| 8,062,098 B2 * | 11/2011 | Duescher | B24B 37/14 451/259 |
| 8,647,178 B2 | 2/2014 | Min et al. | |
| 8,870,626 B2 * | 10/2014 | Wang | B24B 37/30 451/285 |
| 8,920,219 B2 | 12/2014 | Allison et al. | |
| 9,067,298 B2 * | 6/2015 | Lefevre | B24B 37/16 |
| 9,180,570 B2 | 11/2015 | Kerprich et al. | |
| 9,211,628 B2 | 12/2015 | Allison et al. | |
| 9,409,276 B2 | 8/2016 | Tsai et al. | |
| 9,415,479 B2 * | 8/2016 | Lin | B24B 37/26 |
| 9,649,742 B2 * | 5/2017 | Lefevre | B24B 37/22 |
| 2007/0082587 A1 * | 4/2007 | Hosaka | B23B 19/028 451/56 |
| 2008/0220702 A1 | 9/2008 | Feng et al. | |
| 2009/0075568 A1 | 3/2009 | Kimura et al. | |
| 2009/0137187 A1 | 5/2009 | Sung | |
| 2014/0378035 A1 | 12/2014 | Noro et al. | |
| 2017/0036319 A1 * | 2/2017 | Chen | B24B 37/26 |

FOREIGN PATENT DOCUMENTS

| | | |
|---|---|---|
| JP | 2001071256 | 3/2001 |
| JP | 2001071256 A | 3/2001 |
| JP | 2008105117 | 5/2008 |
| JP | 4909706 B2 | 4/2012 |
| TW | 479000 B | 3/2002 |
| TW | M459065 U | 8/2013 |

OTHER PUBLICATIONS

Copending U.S. Appl. No. 15/725,876.
Copending U.S. Appl. No. 15/725,987.
Copending U.S. Appl. No. 15/726,027.

\* cited by examiner

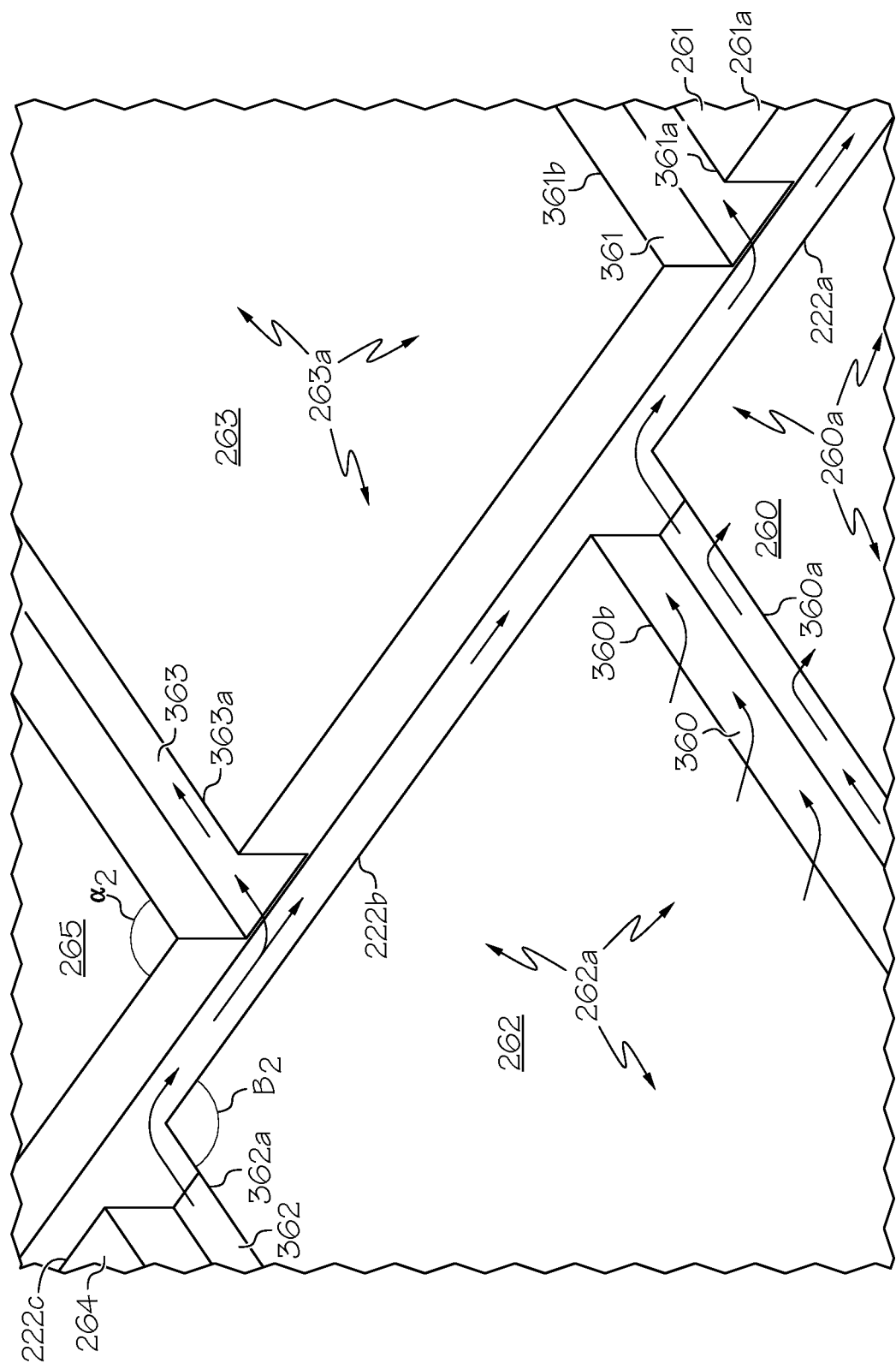

CONTROLLED RESIDENCE CMP POLISHING METHOD

CROSS-REFERENCE TO RELATED APPLICATIONS

This is a continuation-in-part application of U.S. Ser. No. 15/624,943, filed Jun. 16, 2017, now pending, which was a continuation-in-part application of U.S. Ser. No. 15/623,204, filed Jun. 14, 2017, now pending.

BACKGROUND

The present invention relates to grooves for chemical mechanical polishing pads. More particularly, the present invention relates to groove designs for increasing removal rate, improving global uniformity and reducing defects during chemical mechanical polishing.

In the fabrication of integrated circuits and other electronic devices, multiple layers of conducting, semiconducting and dielectric materials are deposited onto and removed from a surface of a semiconductor wafer. Thin layers of conducting, semiconducting and dielectric materials may be deposited using a number of deposition techniques. Common deposition techniques in modern wafer processing include physical vapor deposition (PVD), also known as sputtering, chemical vapor deposition (CVD), plasma-enhanced chemical vapor deposition (PECVD) and electrochemical plating, among others. Common removal techniques include wet and dry isotropic and anisotropic etching, among others.

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful for removing undesired surface topography and surface defects, such as rough surfaces, agglomerated materials, crystal lattice damage, scratches and contaminated layers or materials.

Chemical mechanical planarization, or chemical mechanical polishing (CMP), is a common technique used to planarize or polish work pieces such as semiconductor wafers. In conventional CMP, a wafer carrier, or polishing head, is mounted on a carrier assembly. The polishing head holds the wafer and positions the wafer in contact with a polishing layer of a polishing pad that is mounted on a table or platen within a CMP apparatus. The carrier assembly provides a controllable pressure between the wafer and polishing pad. Simultaneously, a polishing medium (e.g., slurry) is dispensed onto the polishing pad and is drawn into the gap between the wafer and polishing layer. The polishing pad and wafer typically rotate relative to one another to polish a substrate. As the polishing pad rotates beneath the wafer, the wafer sweeps out a typically annular polishing track, or polishing region, wherein the wafer's surface directly confronts the polishing layer. The wafer surface is polished and made planar by chemical and mechanical action of the polishing layer and polishing medium on the surface.

Reinhardt et al., U.S. Pat. No. 5,578,362 discloses the use of grooves to provide macrotexture to the pad. In particular, it discloses a variety of patterns, contours, grooves, spirals, radials, dots or other shapes. Specific examples included in Reinhardt are the concentric circular and the concentric circular superimposed with an X-Y groove. Because the concentric circular groove pattern provides no direct flow path to the edge of the pad, the concentric circular groove has proven the most popular groove pattern.

Lin et al., in U.S. Pat. No. 6,120,366, at FIG. 2, disclose a combination of circular plus radial feeder grooves. This example illustrates adding twenty-four radial feeder grooves to a concentric circular groove pattern. The disadvantage of this groove pattern is that it provides limited improvement in polishing with a substantial increase in slurry usage and shorter pad life due to less landing area on the polishing pad.

Notwithstanding, there is a continuing need for chemical mechanical polishing pads having better combination of polishing performance and slurry usage. Furthermore, there is a need for grooves that increase removal rate, lower slurry usage, improve global uniformity and reduce defects during chemical mechanical polishing.

STATEMENT OF INVENTION

An aspect of the invention provides a method for polishing or planarizing a wafer of at least one of semiconductor, optical and magnetic substrates, the method comprising the following: rotating a polishing pad, the rotating polishing pad having a polishing layer having a polymeric matrix and a thickness, the polishing layer including a center, an outer edge and a radius extending from the center to the outer edge of the polishing pad; radial feeder grooves in the polishing layer separating the polishing layer into polishing regions, the polishing regions being circular sectors defined by two adjacent radial feeder grooves, the radial feeder grooves extending at least from a location adjacent the center to a location adjacent the outer edge; and each polishing region including a series of biased grooves connecting a pair of adjacent radial feeder grooves, a majority of the biased grooves having either an inward bias toward the center of the polishing pad or an outward bias toward the outer edge of the polishing pad, both the inward and outward biased grooves moving polishing fluid toward the outer edge of the polishing pad and either toward the wafer or away from the wafer depending upon inward bias or outward bias and the direction of rotation of the polishing pad; distributing polishing fluid onto the rotating polishing pad and into the radial feeder grooves and the series of biased grooves; and pressing and rotating the wafer against the rotating polishing pad for multiple rotations of the polishing pad to adjust polishing by selecting either i) to increase residence time of the polishing fluid under the wafer for the series of biased grooves inward bias toward the center of the rotating polishing pad or to decrease residence time of the polishing fluid under the wafer for the series of biased grooves outward bias toward the outer edge of the rotating polishing pad during counterclockwise rotation of the polishing pad, or ii) to decrease residence time of the polishing fluid under the wafer for the series of biased grooves inward bias toward the center of the rotating polishing pad or to increase residence time of the polishing fluid under the wafer for the series of biased grooves outward bias toward the outer edge of the rotating polishing pad during clockwise rotation of the polishing pad.

An additional aspect of the invention provides a method for polishing or planarizing a wafer of at least one of semiconductor, optical and magnetic substrates, the method comprising the following: rotating a polishing pad, the rotating polishing pad having a polishing layer having a polymeric matrix and a thickness, the polishing layer including a center, an outer edge and a radius extending from the center to the outer edge of the polishing pad; radial feeder grooves in the polishing layer separating the polishing layer into polishing regions, the polishing regions being circular sectors defined by two adjacent radial feeder grooves, a bisect line bisecting the polishing regions, the radial feeder grooves extending at least from a location adjacent the center to a location adjacent the outer edge; and each polishing region including a series of biased grooves connecting a pair of adjacent radial feeder grooves, a majority of the biased grooves having either an inward bias toward the center of the polishing pad at an angle of 20° to 85° from the bisect line or an outward bias toward the outer edge of the polishing pad at an angle of 95° to 160° from the bisect line, both the inward and outward biased grooves moving polishing fluid toward the outer edge of the polishing pad and either toward the wafer or away from the wafer depending upon inward bias or outward bias and the direction of rotation of the polishing pad; distributing polishing fluid onto the rotating polishing pad and into the radial feeder grooves and the series of biased grooves; and pressing and rotating the wafer against the rotating polishing pad for multiple rotations of the polishing pad to adjust polishing by selecting either i) to increase residence time of the polishing fluid under the wafer for the series of biased grooves inward bias toward the center of the rotating polishing pad or to decrease residence time of the polishing fluid under the wafer for the series of biased grooves outward bias toward the outer edge of the rotating polishing pad during counterclockwise rotation of the polishing pad, or ii) to decrease residence time of the polishing fluid under the wafer for the series of biased grooves inward bias toward the center of the rotating polishing pad or to increase residence time of the polishing fluid under the wafer for the series of biased grooves outward bias toward the outer edge of the rotating polishing pad during clockwise rotation of the polishing pad.

BRIEF DESCRIPTION OF THE DRAWINGS

FIG. 2C is a partial break away schematic view of a radial feeder groove of FIG. 2 with interconnected outward bias grooves.

DETAILED DESCRIPTION

Figure 1:
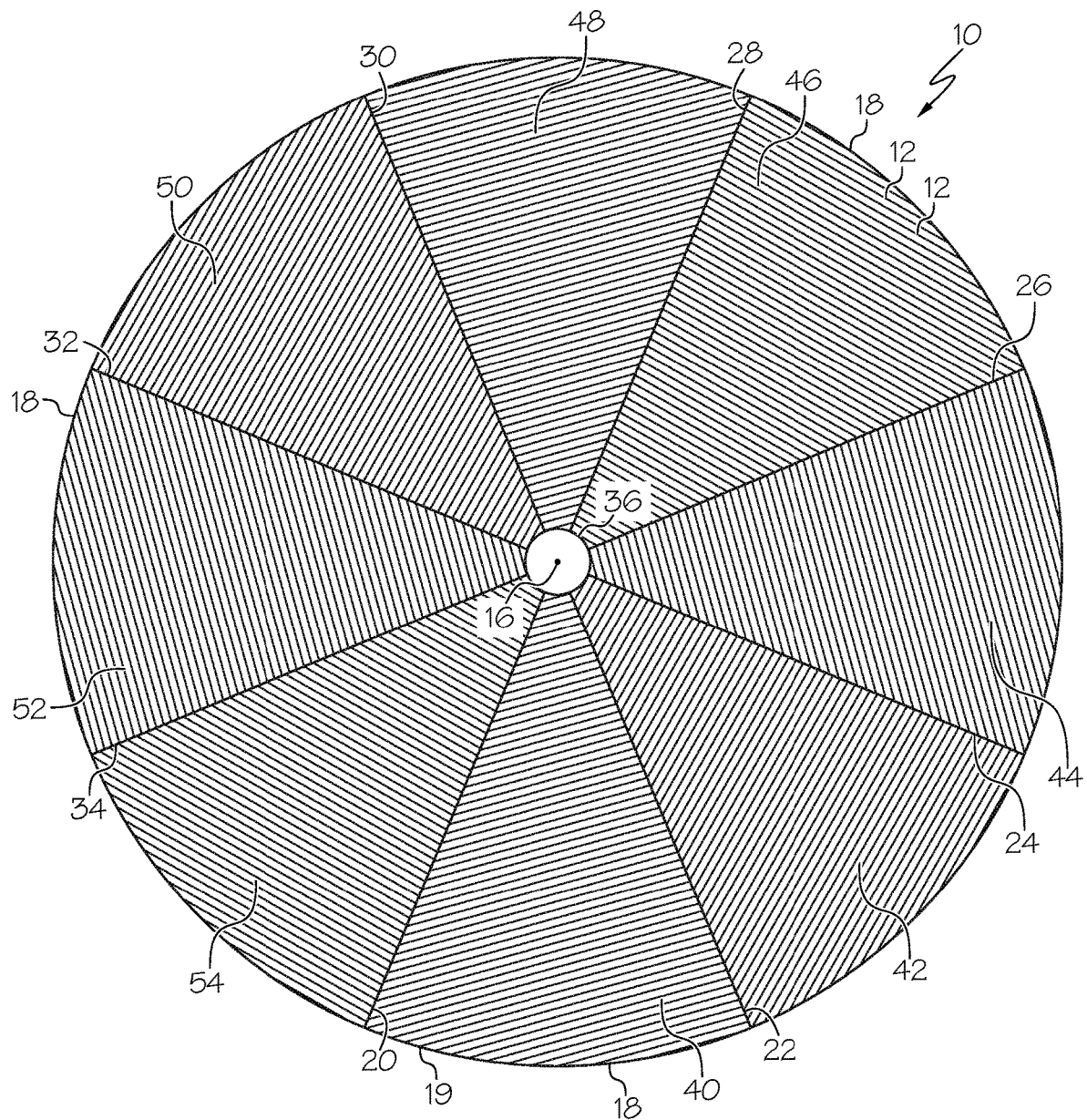
FIG. 1 is a top schematic view of an inward bias polishing pad having eight polishing regions each having a series of inward biased grooves connecting adjacent radial feeder grooves.

The groove pattern and method of the invention provide for controlled and uniform distribution of polishing fluids, such as abrasive-containing slurries and abrasive-free polishing solutions. The efficient distribution allows the user to decrease slurry flow in comparison to conventional grooves. Furthermore the interconnected groove path allows polishing debris to leave the pad in an efficient manner for lowering polishing defects. Finally, the groove pattern improves polishing uniformity, wafer profile, die scale uniformity and can improve edge effects.

The term "trapezoid" as used herein and in the claims means interconnected grooves forming a quadrilateral or four-sided shape having only one pair of parallel sides. The trapezoid has two parallel base sides and two legs connecting the base sides. All angles of the trapezoid add up to 360°.

The term "non-isosceles trapezoid" as used herein and in the claims means interconnected grooves forming a trapezoid having two non-congruent legs or legs of a different length. The leg closer to the pad center has a length less than the leg closer to the perimeter.

The term "circular sector" as used herein and in the claims refers to a portion of a polishing pad defined by two radial feeder grooves and a perimeter arc that extends along the outer edge of the polishing pad. The radial feeder grooves can have a straight radial, curved radial, stepped radial or other shape.

The term "polishing fluid" as used herein and in the claims refers to an abrasive-containing polishing slurry or an abrasive-free polishing solution.

The term "bias angle θ" as used herein refers to the angle between a bisect line bisecting a polishing region and sloped bias grooves connecting adjacent radial feeder grooves. The bisect line shifts with changes in direction of the radial feeder grooves and represents the average from end-to-end of each bias groove.

The term "inward bias angle θ" as used herein and in the claims refers to a bias angle that slopes inward toward the center of the polishing pad measured left to right when viewed downward toward the top of the grooves.

The term "outward bias angle θ" as used herein and in the claims refers to a bias angle that slopes outward toward the perimeter of the polishing pad measured left to right when viewed downward toward the top of the grooves.

The term "wafer" encompasses magnetic, optical and semiconductor substrates. The conventions, such as wafer residence time, contained in this specification assume a polishing fluid drop point to the left of the wafer for counter clockwise rotation and to right of the wafer for clockwise rotation as taken from a top view.

The term "poly(urethane)" as used herein and in the appended claims is a polymer formed by a reaction between isocyanates and compounds containing active-hydrogen groups, specifically including the following: (a) polyurethanes formed from the reaction of (i) isocyanates and (ii) polyols (including diols); and, (b) poly(urethane) formed from the reaction of (i) isocyanates with (ii) polyols (including diols) and (iii) water, amines or a combination of water and amines. Polishing pads of the invention are advantageously a polymer, but most advantageously a polyurethane polymer.

The groove pattern of the invention provides multiple benefits. The first benefit is that a majority of the biased grooves sweep the wafer in the same direction. Sweeping with all the biased grooves in the same direction further increases the benefit. Sweeping a wafer in the same direction pulses the wafer with grooves and provides a beneficial cumulative impact on polishing removal rate. Furthermore, because the biased grooves align in the same direction, it is possible to polish the wafer without oscillating the carrier head or oscillate it with much smaller amplitude or slower oscillation rate. This allows the wafer to be polished at a fixed location further away from the pad center, closer to the edge of the polishing pad. At these locations adjacent to the outer edge, the pad rotates faster than the center to further increase removal rate. In addition, polishing in a nonoscillation mode provides consistent edge profiles over multiple wafers, and reduces defects, improves polishing pad life and retaining ring life due to less wear with polishing pad and retaining ring. Turning off the oscillation also allows use of manufacturing tools with decreased platen size. This is of particular importance for dual platen and 450 mm size CMP tools. In addition, it is possible to use a combination of the number of radial grooves, platen speed and bias angle θ to adjust center profile between fast and slow and to provide consistent flat profiles.

In addition, the feeder grooves and bias grooves combine to facilitate uniform slurry distribution across the polishing pad and provide better slurry distribution across the wafer surface. This allows adjusting the polishing rate profile across the wafer, improving global uniformity by changing the platen speed or bias angle θ or both. Furthermore, the wafer edge profile can be adjusted as well by optimizing the bias angle θ or carrier speed or both. This is more critical for wafer-edge yield in advanced logic and 3D NAND with extremely low edge exclusions. Typically, the polishing pad has at least three feeder grooves, and can be varied between 3 to 32 grooves. Typically, the wafer alternates between being over one radial feeder groove and multiple biased grooves and being over two or multiple radial feeder grooves and multiple biased grooves. This uniform distribution eliminates pooling at the carrier ring and allows the polishing pad to operate in a more efficient manner or with decreased slurry flow.

Another unexpected feature of the invention is that it allows polishing at higher downforce than conventional grooves due to better slurry distribution at wafer surface and reducing excessive heat and polishing temperature between wafer and pad. This is particularly important for CMP metal polishing, such as copper, tantalum and tungsten polishing. These metal layers, dielectric layers, insulator layers and other material layers all represent wafer components. The groove pattern of the invention operates with both porous and non-porous polishing pads. The groove pattern of the invention has particular utility for precision polishing with non-porous polishing pads, such as for atomic scale polishing for removing a single monatomic layer at a time.

Since both inward and outward biased grooves direct polishing fluid off the polishing pad, it provides efficient polishing debris removal for lower defects.

Figure 1A:
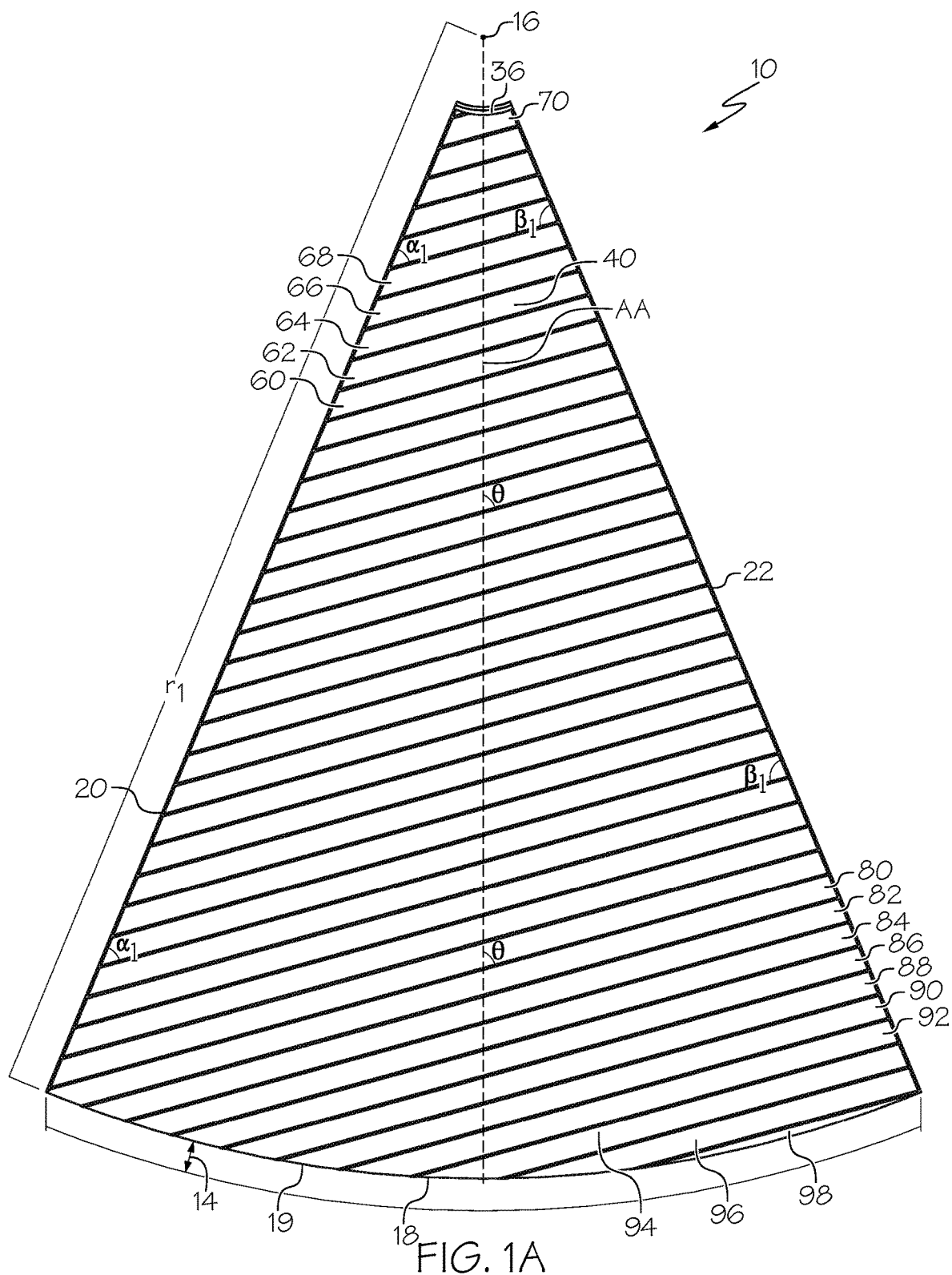
FIG. 1A is a partial break away schematic top view of the inward bias polishing pad of FIG. 1.

Referring to FIGS. 1 and 1A, the polishing pad 10 of the invention is suitable for polishing or planarizing at least one of semiconductor, optical and magnetic substrates. The polishing layer 12 has a polymeric matrix and a thickness 14. The polishing layer 12 includes a center 16, an outer edge 18 and a radius (r) extending from the center 16 to the outer edge 18. Advantageously the wafer remains positioned at a location along the radius r from the center 16 of the polishing pad 10 closer to the outer edge 18 of the polishing pad then the center 16 of the polishing pad 10 to increase removal rate of at least one component of the wafer. Radial feeder grooves 20, 22, 24, 26, 28, 30, 32 and 34 initiate from center 16 or from optional circular groove 36. Radial feeder grooves 20, 22, 24, 26, 28, 30, 32 and 34 separate the polishing layer 12 into polishing regions 40, 42, 44, 46, 48, 50, 52 and 54. In particular, two adjacent radial feeder grooves, such as 20 and 22, combine with perimeter arc 19 of outer edge 18 to define polishing region 40. Polishing region 40, along with polishing regions 42, 44, 46, 48, 50, 52 and 54 have a shape of a circular sector with a small circular sector broken away at the center 16. The radial feeder grooves 20, 22, 24, 26, 28, 30, 32 and 34 advanta- geously extend at least from circular groove 36 adjacent the center 16 to or adjacent the outer edge 18.

Figure 1B:
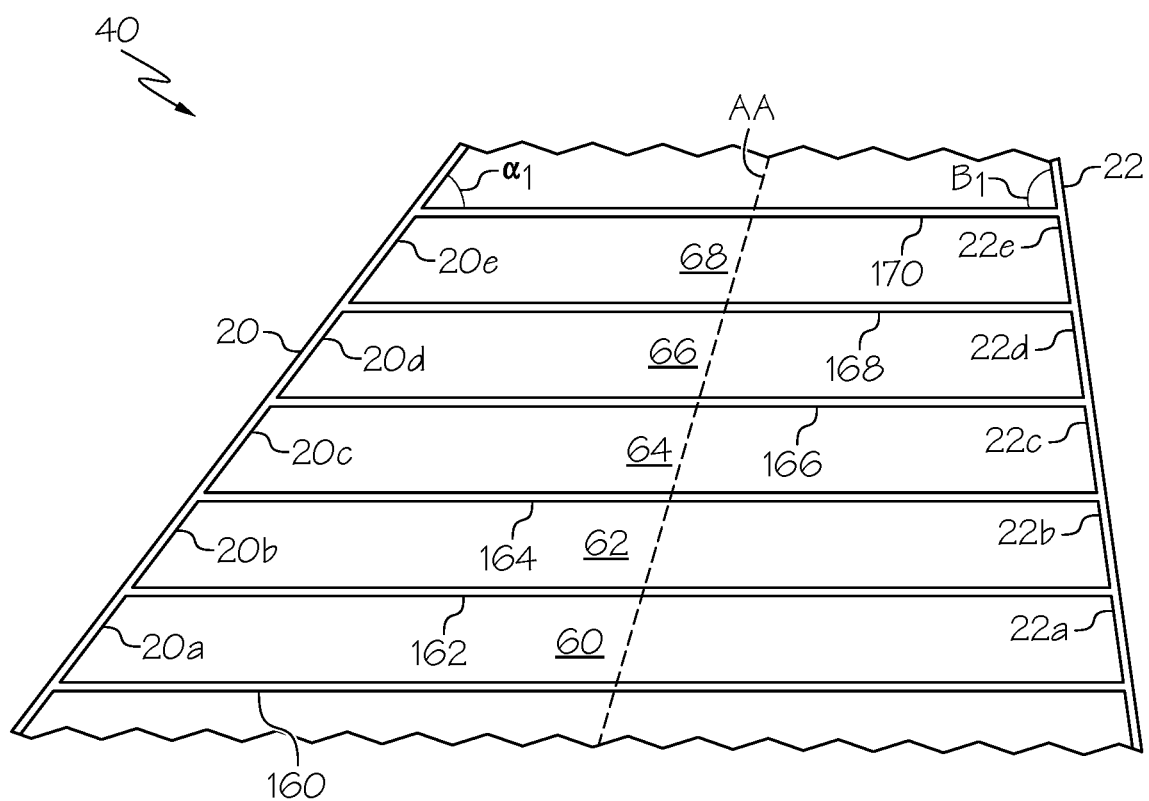
FIG. 1B is a partial break away schematic top view of a series of non-isosceles trapezoid grooves of FIG. 1A rotated to render the trapezoid legs parallel with the bottom of the drawing.

Referring to FIGS. 1A and 1B, polishing region 40 includes a series of stacked trapezoid groove regions 60, 62, 64, 66 and 68. Polishing region 40 represents a circular sector of polishing pad 10 (FIG. 1) with the center region being groove-free. Parallel linear grooves or parallel base grooves 160, 162, 164, 166, 168 and 170 define the top and bottom of the trapezoid groove regions 60, 62, 64, 66 and 68. Radial feeder groove segments 20a, 20b, 20c, 20d and 20e of radial feeder groove 20 define the left side of trapezoid groove regions 60, 62, 64, 66 and 68, respectively. Radial feeder groove segments 22a, 22b, 22c, 22d and 22e of radial feeder groove 22 define the right side of trapezoid groove regions 60, 62, 64, 66 and 68, respectively. Polishing regions 40, 42, 44, 46, 48, 50, 52 and 54 (FIG. 1) all include a series of trapezoid groove regions spaced with parallel base grooves. To accommodate the shape of a circular polishing pad 10 or a circular sector shape of polishing regions 40, 42, 44, 46, 48, 50, 52 and 54, trapezoid groove regions are often cut to accommodate the outer edge 18 or circular groove 36.

The trapezoid groove regions 60, 62, 64, 66 and 68 all represent non-isosceles trapezoid regions with the radial side segments being of different lengths. Because this grove pattern has an inward bias toward the center, radial feeder groove segments 20a, 20b, 20c, 20d and 20e are longer than radial 22a, 22b, 22c, 22d and 22e, respectively. In addition to each trapezoid groove region representing a non-isosceles trapezoid, the perimeter of stacked trapezoid regions such as the perimeter of trapezoid regions 60 and 62 and the perimeter of trapezoid regions 60, 62 and 64 also define a non-isosceles trapezoid. The trapezoid region 70 adjacent the circular groove 36 has a portion broken away to accommodate the circular groove 36. Similarly, trapezoid groove regions 80, 82, 84, 86, 88, 90, 92, 94, 96 and 98 adjacent outer edge 18 all have portions broken away to accommodate the circular shape of the outer edge 18 of the polishing pad 10. Rotating the polishing pad sends used polishing fluid through a portion of the series of biased grooves adjacent trapezoid groove regions 80, 82, 84, 86, 88, 90, 92, 94, 96 and 98 over the outer edge 18 of the polishing pad 10 to allow flow of new polishing fluid under the wafer.

Referring to FIG. 1A, the dashed line AA bisects polishing region 40 by connecting center 16 to the midpoint of perimeter arc 19 of outer edge 18. The base legs of spaced trapezoid groove regions 80, 82, 84, 86, 88, 90, 92, 94 and 96 intersect line AA at an angle θ. For purposes of the specification, angle θ is the upper right angle when the center is on top and the outer edge is on the bottom—illustrated in FIGS. 1A and 2A. Advantageously, angle θ is 20 to 85° for inward biased grooves. More advantageously, angle θ is 30 to 80° for inward biased grooves. Radial feeder groove 20 intersects trapezoid groove regions 60, 62, 64, 66 and 68 at an angle $\alpha_1$. Radial feeder groove 22 intersects trapezoid groove regions 60, 62, 64, 66 and 68 at an angle $\beta_1$. For inward biased trapezoid groove regions 60, 62, 64, 66 and 68, the angle of $\alpha_1$ is less than the angle of $\beta_1$.

Referring to FIG. 1B, polishing regions, 60, 62, 64, 66 and 68 are a series of spaced non-isosceles trapezoid groove structures. The trapezoid groove structures have parallel base segments 160, 162, 164, 166, 168 and 170 connecting two adjacent radial feeder grooves 20 and 22 to form leg segments 20a, 20b, 20c, 20d and 20e and 22a, 22b, 22c, 22d and 22e, respectively. The base segments 160, 162, 164, 166, 168 and 170 intersect each of the leg segments (20a, 20b, 20c, 20d and 20e) and (22a, 22b, 22c, 22d and 22e) at different angles. The series of non-isosceles trapezoid groove structures extend from adjacent the outer edge toward the center of the polishing pad. The perimeter of the series of trapezoid structures 60, 62, 64, 66 and 68 also is a trapezoid.

Rotation of the polishing pad moves polishing fluid through the base segments 160, 162, 164, 166, 168 and 170 and the leg segments (20a, 20b, 20c, 20d and 20e) and (22a, 22b, 22c, 22d and 22e) toward the outer edge of the polishing pad. In addition to the outward movement, the polishing fluid moves toward the wafer for clockwise rotation of the polishing pad and also away from the wafer for counterclockwise rotation of the polishing pad. The motion of the polishing fluid toward the wafer reduces residence time for slurry under the wafer and motion away from the wafer increases residence time for slurry under the wafer. For example, an inward bias can increase residence time for counterclockwise platen rotation. Advantageously, all the polishing regions have the same bias.

Figure 1C:
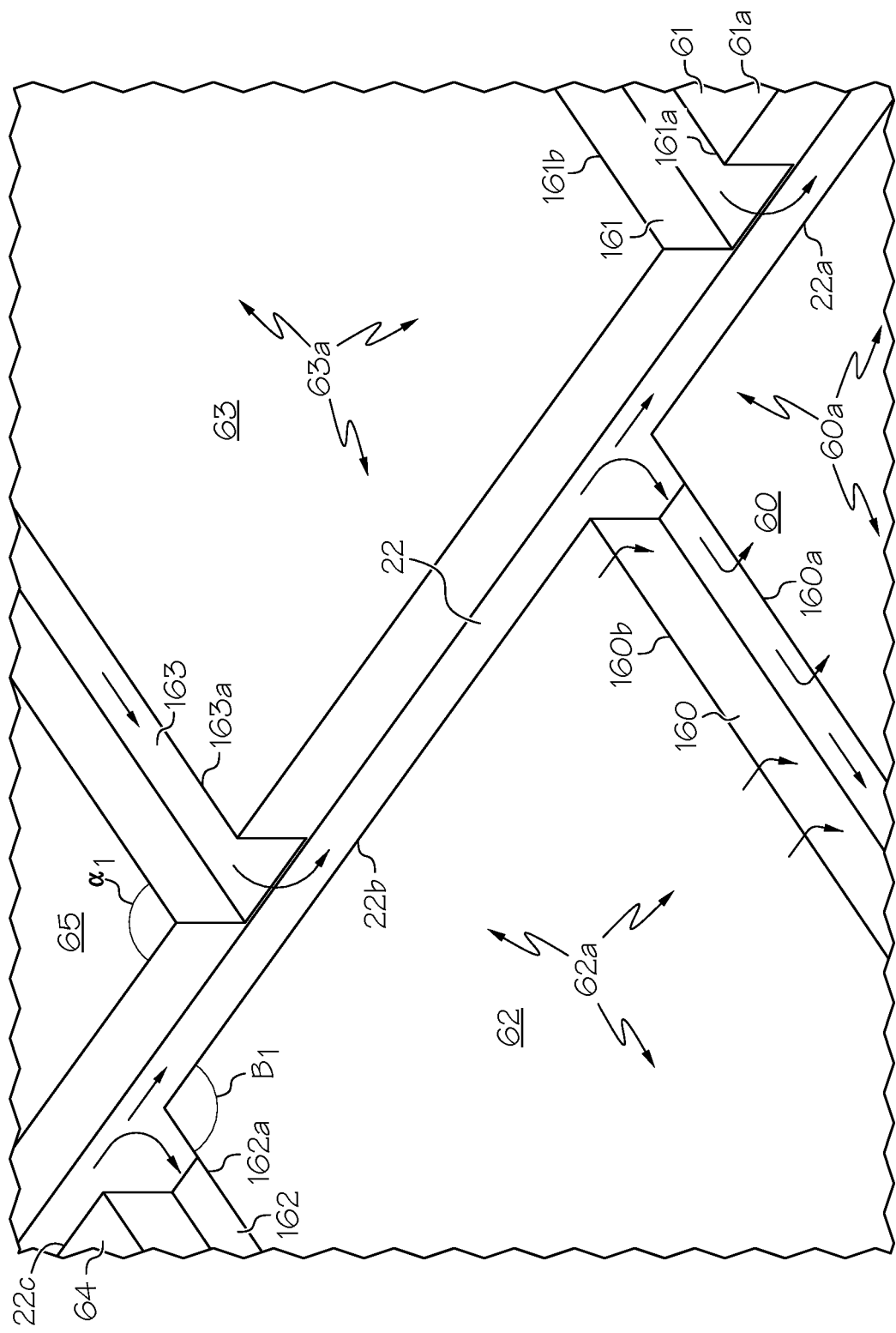
FIG. 1C is a partial break away schematic view of a radial feeder groove of FIG. 1 with interconnected inward bias grooves.

Referring to FIG. 1C during rotation, polishing fluid distributes onto the rotating polishing pad and into the radial feeder groove 22 (22a, 22b and 22c) and the series of biased grooves 160, 161, 162 and 163. Centrifugal forces move polishing fluid toward the outer edge of the polishing pad through the radial feeder groove 22 (22a, 22b and 22c), and the series of bias grooves 160, 161, 162 and 163 in the direction of the arrows. In addition, polishing fluid moves outward by overflowing the outer walls 160a, 161a, 162a and 163a to wet land areas 60a, 61a, 62a and 63a, respectively. Then the polishing fluid flows into inner walls 161b and 160b of subsequent bias grooves 160 and 162, respectively (other bias grooves not visible and inner walls not visible for the flow along land areas 60a and 61a). Flow arrows at inner wall 160b and outer wall 160a illustrate flow of polishing fluid into and out of inward bias groove 160. Typically, bias grooves 160 and 162 do not align with bias grooves 161 and 163. This non-alignment of bias grooves between adjacent polishing regions facilitates flow down radial feeder groove 22 for improved slurry distribution. In alternative embodiments, it is possible to align bias grooves of adjacent polishing regions. Pressing and rotating the wafer against the rotating polishing pad for multiple rotations removes at least one component of the wafer with land areas 60a, 61a, 62a and 63a all wet by the overflowing polishing fluid.

Referring to FIGS. 1 to 1C, the polishing pad 10 preferably contains at least 20 inward biased grooves, such as 160, 162, 164, 166, 168 and 170 in each polishing region 40, 42, 44, 46, 48, 50, 52 and 54. These inward bias grooves represent groove segments that connect between adjacent radial feeder grooves; and they combine to increase slurry residence time under a wafer substrate with counterclockwise platen rotation. More preferably, the polishing pad 10 contains 20 to 1,000 inward biased grooves in each polishing region 40, 42, 44, 46, 48, 50, 52 and 54. Most preferably, the polishing pad 10 contains 20 to 500 inward biased grooves in each polishing region 40, 42, 44, 46, 48, 50, 52 and 54.

Typically, polishing pad 10 has at least 15 times of total inward biased grooves, such as 160, 162, 164, 166, 168 and 170 to total radial feeder grooves 20, 22, 24, 26, 28, 30, 32 and 34 (8). For example, there may be 20 to 1,000 times as many total inward biased grooves to total radial feeder grooves 20, 22, 24, 26, 28, 30, 32 and 34 (8) on the polishing pad 10. Preferably, there may be 20 to 500 times as many total inward biased grooves to total radial feeder grooves 20, 22, 24, 26, 28, 30, 32 and 34 (8) on the polishing pad 10.

Figure 2:
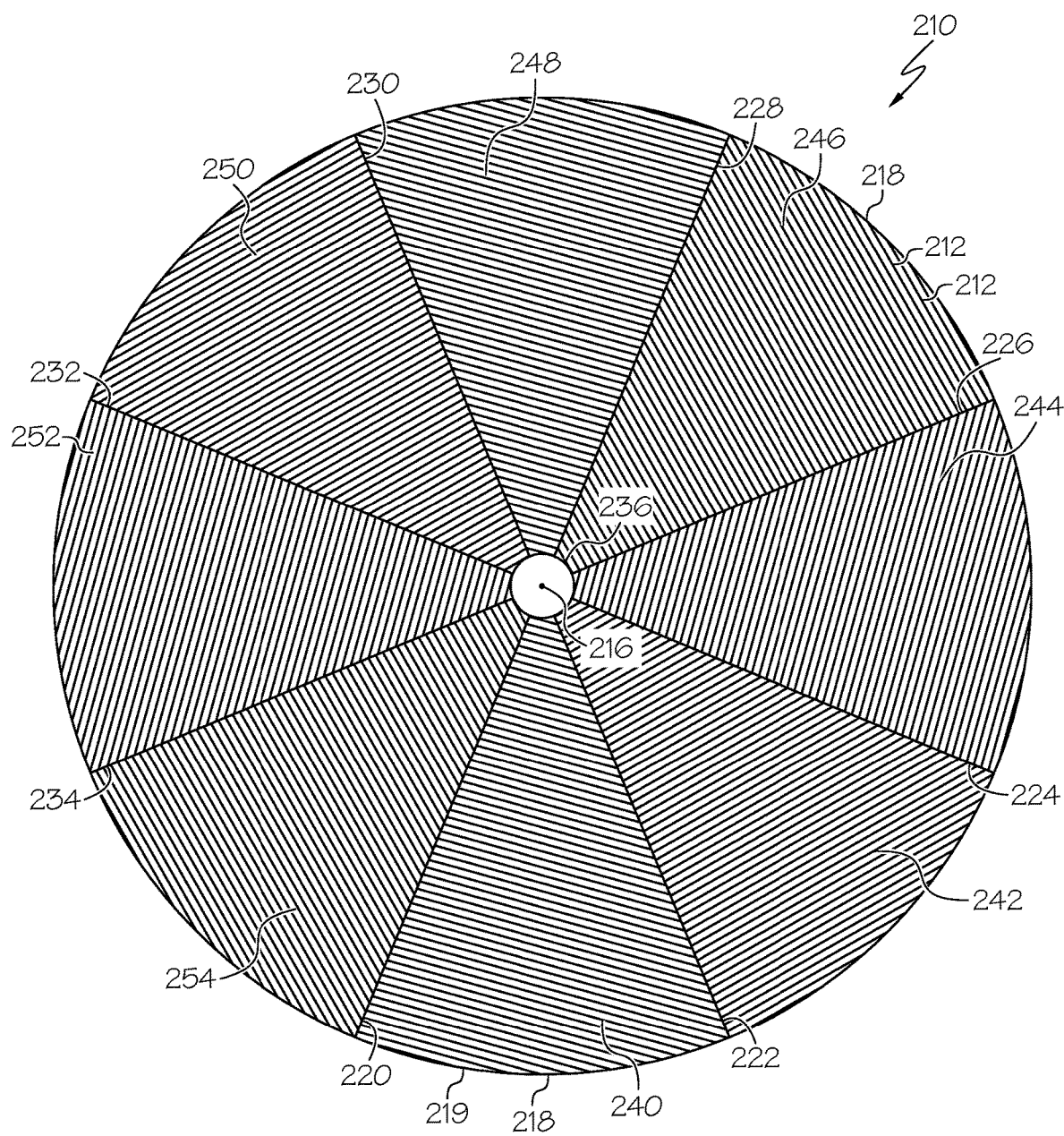
FIG. 2 is a top schematic view of an outward bias polishing pad having eight polishing regions each having a series of outward biased grooves connecting adjacent radial feeder grooves.
Figure 2A:
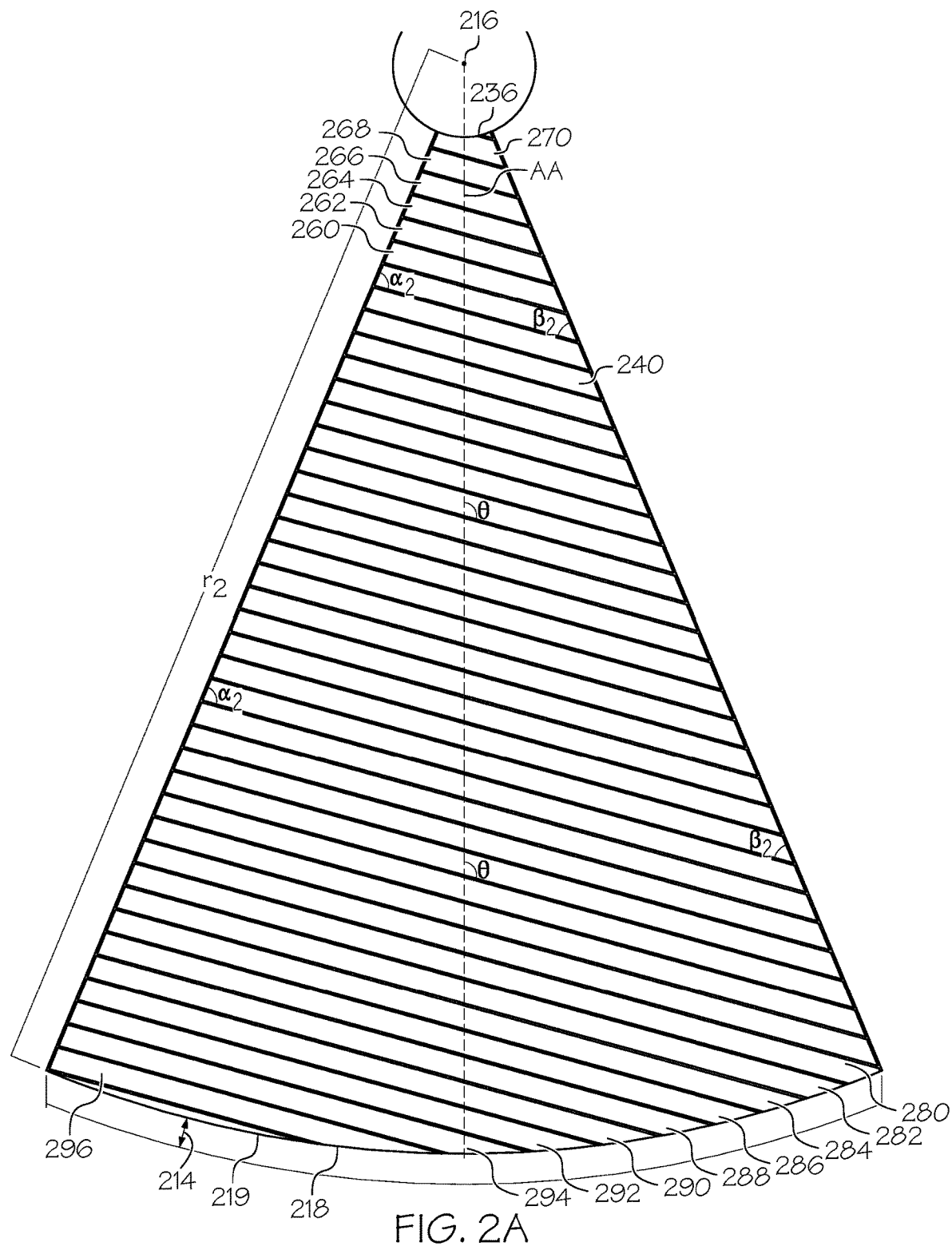
FIG. 2A is a partial break away schematic top view of the outward bias polishing pad of FIG. 2.

Referring to FIGS. 2 and 2A, the polishing pad 210 of the invention is suitable for polishing or planarizing at least one of semiconductor, optical and magnetic substrates. The polishing layer 212 has a polymeric matrix and a thickness 214. The polishing layer 212 includes a center 216, an outer edge 218 and a radius (r) extending from the center 216 to the outer edge 218. Advantageously the wafer remains positioned at a location along the radius r from the center 216 of the polishing pad 210 closer to the outer edge 218 of the polishing pad then the center 216 of the polishing pad 210 to increase removal rate of at least one component of the wafer. Radial feeder grooves 220, 222, 224, 226, 228, 230, 232 and 234 initiate from center 216 or from optional circular groove 236. Radial feeder grooves 220, 222, 224, 226, 228, 230, 232 and 234 separate the polishing layer 212 into polishing regions 240, 242, 244, 246, 248, 250, 252 and 254. In particular, two adjacent radial feeder grooves, such as 220 and 222, combine with perimeter arc 219 of outer edge 218 to define polishing region 240. Polishing region 240, along with polishing regions 242, 244, 246, 248, 250, 252 and 254 have a shape of a circular sector with a small circular sector broken away at the center 216. The radial feeder grooves 220, 222, 224, 226, 228, 230, 232 and 234 advantageously extend at least from circular groove 236 adjacent the center 216 to or adjacent the outer edge 18.

Figure 2B:
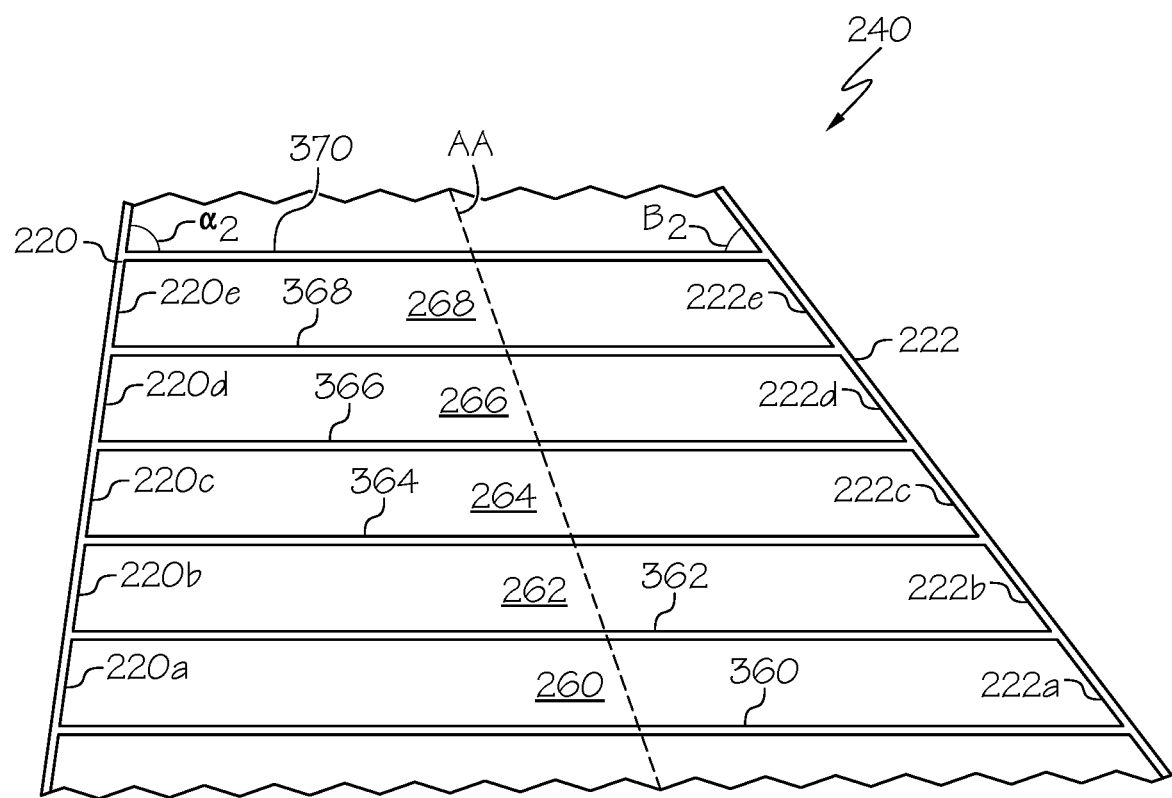
FIG. 2B is a partial break away schematic top view of a series of non-isosceles trapezoid grooves of FIG. 2A rotated to render the trapezoid legs parallel with the bottom of the drawing.

Referring to FIGS. 2A and 2B, polishing region 240 includes a series of stacked trapezoid groove regions 260, 262, 264, 266 and 268. Polishing region 240 represents a circular sector of polishing pad 210 (FIG. 2) with the center region being groove-free. Parallel linear grooves or parallel base grooves 360, 362, 364, 366, 368 and 370 define the top and bottom of the trapezoid groove regions 260, 262, 264, 266 and 268. Radial feeder groove segments 220a, 220b, 220c, 220d and 220e of radial feeder groove 220 define the left side of trapezoid groove regions 260, 262, 264, 266 and 268, respectively. Radial feeder groove segments 222a, 222b, 222c, 222d and 222e of radial feeder groove 222 define the right side of trapezoid groove regions 260, 262, 264, 266 and 268, respectively. Polishing regions 240, 242, 244, 246, 248, 250, 252 and 254 (FIG. 2) all include a series of trapezoid groove regions spaced with parallel base grooves. To accommodate the shape of a circular polishing pad 210 or a circular sector shape of polishing regions 240, 242, 244, 246, 248, 250, 252 and 254, trapezoid groove regions are often cut to accommodate the outer edge 218 or circular groove 236.

The trapezoid groove regions 260, 262, 264, 266 and 268 all represent non-isosceles trapezoid regions with the radial side segments being of different lengths. Because this grove pattern has an outward bias toward the outer edge 218, radial feeder groove segments 220a, 220b, 220c, 220d and 220e are longer than radial 222a, 222b, 222c, 222d and 222e, respectively. In addition to each trapezoid groove region representing a non-isosceles trapezoid, the perimeter of stacked trapezoid regions such as the perimeter of trapezoid regions 260 and 262; and the perimeter of trapezoid regions 260, 262 and 264 also define a non-isosceles trapezoid. The trapezoid region 270 adjacent the circular groove 236 has a portion broken away to accommodate the circular groove 236. Similarly, trapezoid groove regions 280, 282, 284, 286, 288, 290, 292, 294 and 296 adjacent outer edge 218 all have portions broken away to accommodate the circular shape of the outer edge 218 of the polishing pad 210. Rotating the polishing pad sends used polishing fluid through a portion of the series of biased grooves adjacent trapezoid groove regions 280, 282, 284, 286, 288, 290, 292, 294 and 296 over the outer edge 218 of the polishing pad 210 to allow flow of new polishing fluid under the wafer.

Referring to FIG. 2A, the dashed line AA bisects polishing region 240 by connecting center 216 to the midpoint of perimeter arc 219 of outer edge 218. The base legs of spaced trapezoid groove regions 280, 282, 284, 286, 288, 290 and 292 intersect line AA at an angle θ. For purposes of the specification, angle θ is the upper right angle when the center is on top and the outer edge is on the bottom—illustrated in FIGS. 1A and 2A. Advantageously, angle θ is 95 to 160° for outward biased grooves. More advantageously, angle θ is 100 to 150° for outward biased grooves. Radial feeder groove 220 intersects trapezoid groove regions 260, 262, 264, 266 and 268 at an angle $α_z$. Radial feeder groove 222 intersects trapezoid groove regions 260, 262, 264, 266 and 268 at an angle $β_z$. For outward biased trapezoid groove regions 260, 262, 264, 266 and 268, the angle of $α_z$ is greater than the angle of $β_2$.

Referring to FIG. 2B, polishing regions, 260, 262, 264, 266 and 268 are a series of spaced non-isosceles trapezoid groove structures. The trapezoid groove structures have parallel base segments 360, 362, 364, 366, 368 and 370 connecting two adjacent radial feeder grooves 220 and 222 to form leg segments 220a, 220b, 220c, 220d and 220e and 222a, 222b, 222c, 222d and 222e, respectively. The base segments 360, 362, 364, 366, 368 and 370 intersect each of the leg segments (220a, 220b, 220c, 220d and 220e) and (222a, 222b, 222c, 222d and 222e) at different angles. The series of non-isosceles trapezoid groove structures extend from adjacent the outer edge toward the center of the polishing pad. The perimeter of the series of trapezoid structures 260, 262, 264, 266 and 268 also is a trapezoid.

Rotation of the polishing pad moves polishing fluid through the base segments 360, 362, 364, 366, 368 and 370 and the leg segments (220a, 220b, 220c, 220d and 220e) and (222a, 222b, 222c, 222d and 222e) toward the outer edge of the polishing pad. In addition to the outward movement, the polishing fluid moves toward the wafer for clockwise rotation of the polishing pad and also away from the wafer for counterclockwise rotation of the polishing pad. The motion of the polishing fluid toward the wafer reduces residence time for slurry under the wafer and motion away from the wafer increases residence time for slurry under the wafer. For example, an outward bias can decrease residence time for counterclockwise platen rotation. Advantageously, all the polishing regions have the same bias.

Referring to FIG. 2C, during rotation, polishing fluid distributes onto the rotating polishing pad and into the radial feeder groove 222 (222a, 222b and 222c) and the series of biased grooves 360, 361, 362 and 163. Centrifugal forces move polishing fluid toward the outer edge of the polishing pad through the radial feeder groove 222 (222a, 222b and 222c), and the series of bias grooves 360, 361, 362 and 363 in the direction of the arrows. In addition, polishing fluid moves outward by overflowing the outer walls 360a, 361a, 362a and 363a to wet land areas 260a, 261a, 262a and 263a, respectively. Then the polishing fluid flows into inner walls 361b and 360b of subsequent bias grooves 360 and 362, respectively (other bias grooves not visible and inner walls not visible for the flow along land areas 60a and 61a). Flow arrows at inner wall 360b and outer wall 360a illustrate flow of polishing fluid into and out of outward bias groove 360. Typically, bias grooves 360 and 362 do not align with bias grooves 361 and 363. This non-alignment of bias grooves between adjacent polishing regions facilitates flow down radial feeder groove 222 for improved slurry distribution. In alternative embodiments, it is possible to align bias grooves of adjacent polishing regions. Pressing and rotating the wafer against the rotating polishing pad for multiple rotations removes at least one component of the wafer with land areas 260a, 261a, 262a and 263a all wet by the overflowing polishing fluid.

Referring to FIGS. 2 to 2C, the polishing pad 210 preferably contains at least 20 outward biased grooves such as 260, 262, 264, 266, 268 and 270 in each polishing region 240, 242, 244, 246, 248, 250, 252 and 254. These outward bias grooves represent groove segments that connect between adjacent radial feeder grooves; and they combine to decrease slurry residence time under a wafer substrate with counterclockwise platen rotation. More preferably, the polishing pad 210 contains 20 to 1,000 outward biased grooves in each polishing region 240, 242, 244, 246, 248, 250, 252 and 254. Most preferably, the polishing pad 210 contains 20 to 500 outward biased grooves in each polishing region 240, 242, 244, 246, 248, 250, 252 and 254.

Typically, polishing pad 210 has at least 15 times of total outward biased grooves, such as 360, 362, 364, 166, 368 and 370 to total radial feeder grooves 220, 222, 224, 226, 228, 230, 232 and 234 (8). For example, there may be 20 to 1,000 times as many total outward biased grooves to total radial feeder grooves 220, 222, 224, 226, 228, 230, 232 and 234 (8) on the polishing pad 210. Preferably, there may be 20 to 500 times as many total outward biased grooves to total radial feeder grooves 220, 222, 224, 226, 228, 230, 232 and 234 (8) on the polishing pad 210.

Figure 3A:
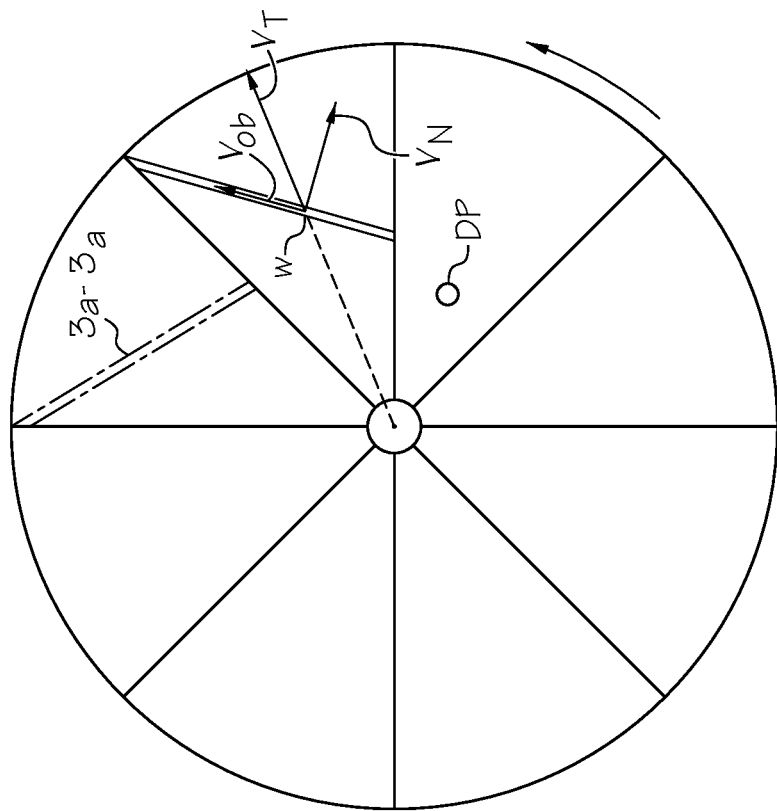
FIG. 3A is a schematic depiction of how outward bias grooves channel polishing fluid toward the outer edge of the polishing pad to decrease polishing fluid residence time under a wafer for counterclockwise platen rotation.
Figure 3:
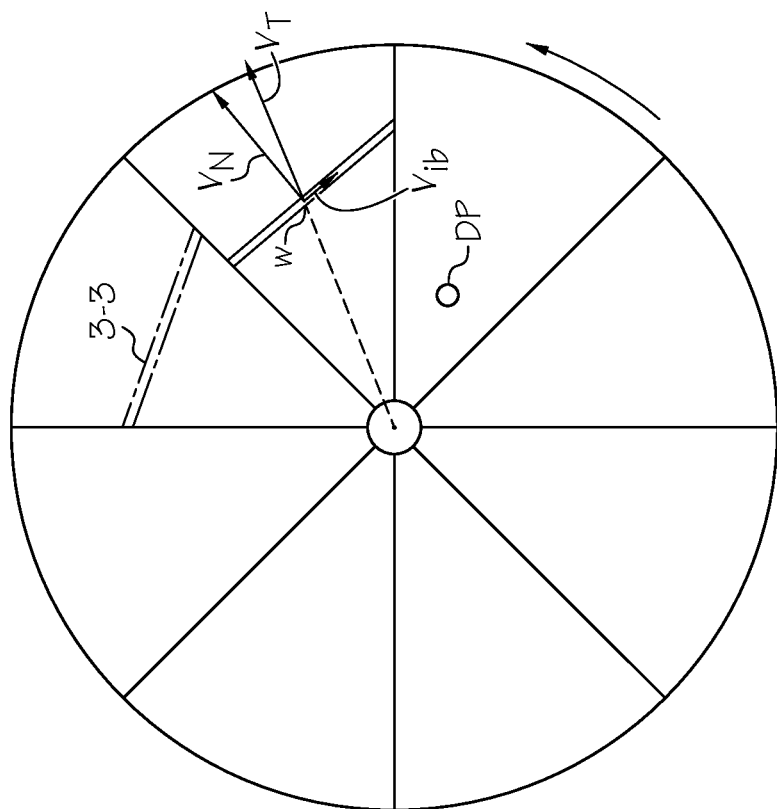
FIG. 3 is a schematic depiction of how inward bias grooves channel polishing fluid toward the outer edge of the polishing pad to increase polishing fluid residence time under a wafer for counterclockwise platen rotation.

Referring to FIGS. 3 and 3A, slurry flow vectors illustrate how centrifugal motion of the polishing pad results in outward motion of the polishing fluid through the bias grooves 3-3 and 3a-3a. Arrows illustrate counter clockwise platen rotation direction with DP representing a typical slurry drop point. The slurry vector intersects at point W that represents a slurry flow point under a wafer. In the case of an inward bias groove (FIG. 3), $V_{ib}$ represents the outward velocity of polishing fluid through an inward bias groove 3-3 and $V_N$ represents the slurry flow normal to the inward bias groove 3-3. The resulting slurry flow $V_T$ or velocity total becomes slower with respect to the wafer to increase polishing fluid residence time under the wafer. In the case of an outward bias groove (FIG. 3A), $V_{ob}$ represents the outward velocity of polishing fluid through an outward bias groove 3a-3a and $V_N$ represents the slurry flow normal to the inward bias groove 3a-3a. The resulting slurry flow $V_T$ or velocity total becomes faster with respect to the wafer to decrease polishing fluid residence time under the wafer. With this groove configuration, platen velocity and bias angle combine to control polishing fluid residence time.

Figure 4A:
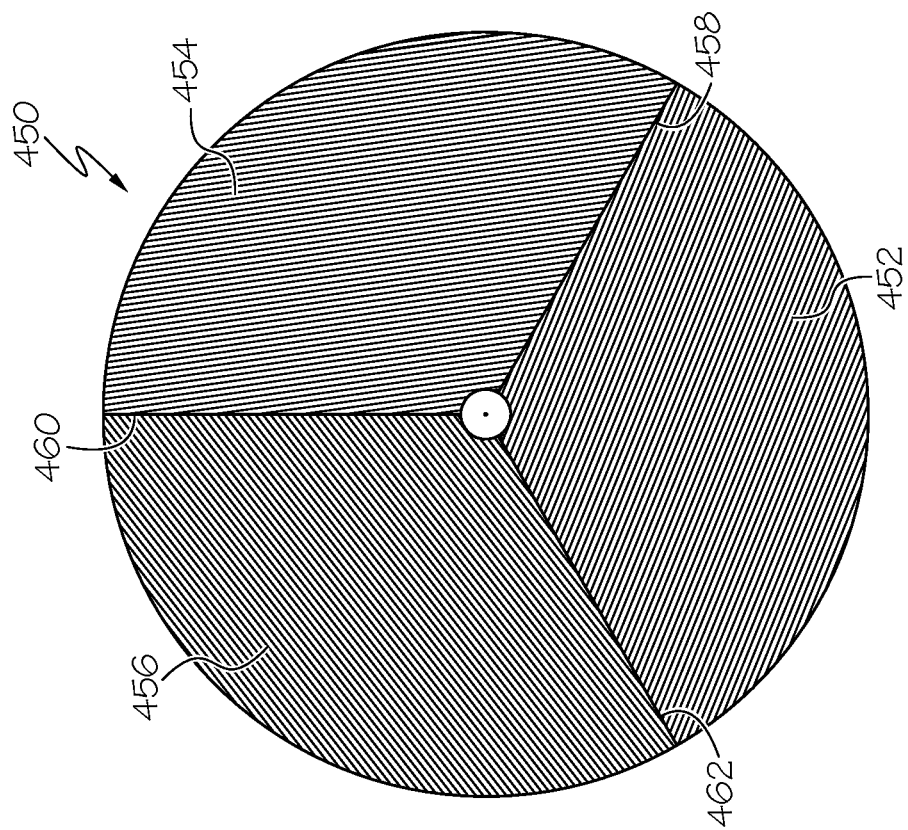
FIG. 4A is a top schematic view of an outward bias polishing pad having three polishing regions each having a series of outward biased grooves connecting adjacent radial feeder grooves.
Figure 4:
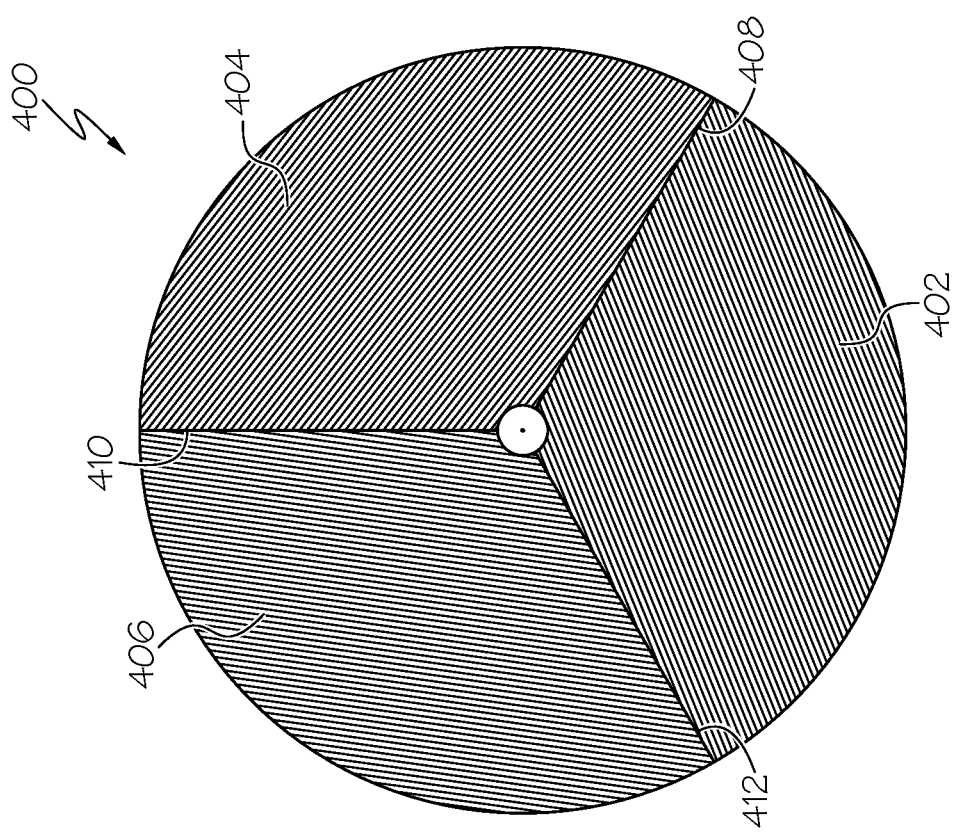
FIG. 4 is a top schematic view of an inward bias polishing pad having three polishing regions each having a series of inward biased grooves connecting adjacent radial feeder grooves.

Referring to FIG. 4, inward bias polishing pad 400 has three polishing regions 402, 404 and 406. Radial feeder grooves 408, 410 and 412 separate the polishing pad 400 into the polishing regions 402, 404 and 406 of equal size separated by 120 degrees. In an alternative embodiment not shown, it is possible to separate the polishing regions into two sizes, such as 100 degrees, 100 degrees and 160 degrees. In a further alternative embodiment, it is possible to separate the polishing regions into three different sizes, such as 100 degrees, 120 degrees and 140 degrees. As polishing pad 400 rotates, the long biased grooves sweep the wafer to improve removal rate. With this embodiment, it is advantageous for the radial feeder grooves 408, 410 and 412 to have a larger cross section than the biased grooves to improve distribution of the polishing fluid.

Referring to FIG. 4A, outward bias polishing pad 450 has three polishing regions 452, 454 and 456. Radial feeder grooves 458, 460 and 462 separate the polishing pad 450 into the polishing regions 452, 454 and 456 of equal size separated by 120 degrees. In an alternative embodiment not shown, it is possible to separate the polishing regions into two sizes, such as 100 degrees, 100 degrees and 160 degrees. In a further alternative embodiment, it is possible to separate the polishing regions into three different sizes, such as 100 degrees, 120 degrees and 140 degrees. As polishing pad 450 rotates, the long biased grooves sweep the wafer to improve removal rate. With this embodiment, it is advantageous for the radial feeder grooves 458, 460 and 462 to have a larger cross section than the biased grooves to improve distribution of the polishing fluid.

Figure 5A:
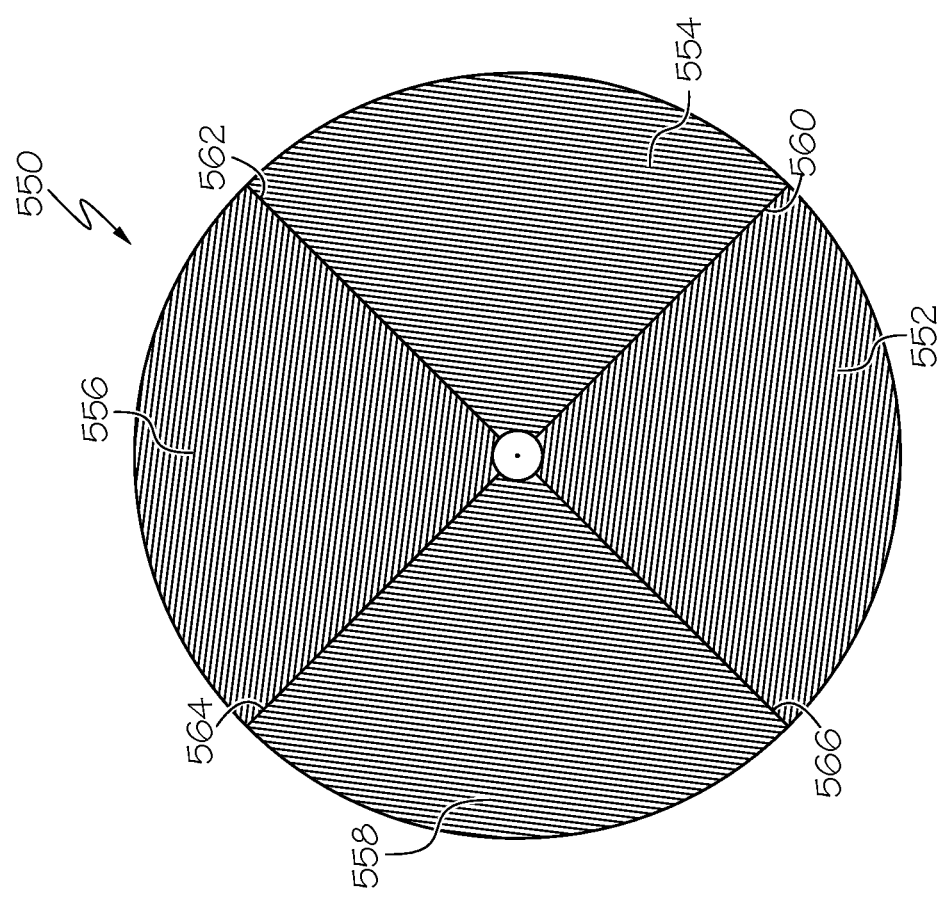
FIG. 5A is a top schematic view of an outward bias polishing pad having four polishing regions each having a series of outward biased grooves connecting adjacent radial feeder grooves.
Figure 5:
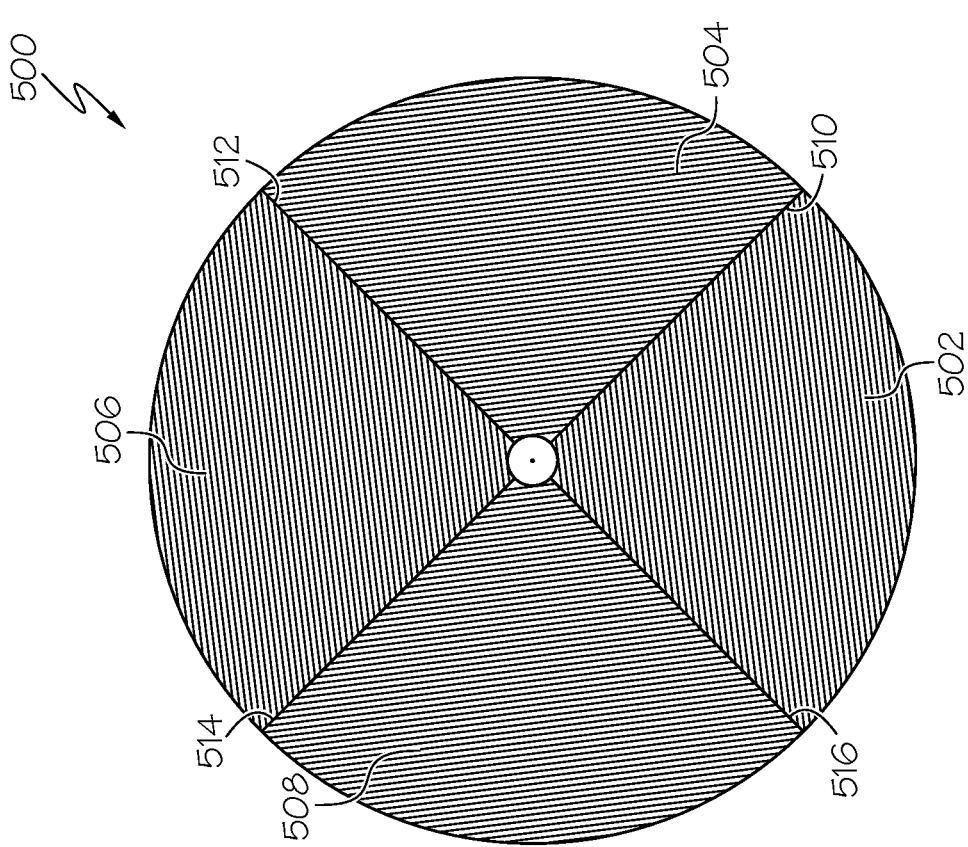
FIG. 5 is a top schematic view of an inward bias polishing pad having four polishing regions each having a series of inward biased grooves connecting adjacent radial feeder grooves.

Referring to FIG. 5, inward bias polishing pad 500 has four polishing regions 502, 504, 506 and 508. Radial feeder grooves 510, 512, 514 and 516 separate the polishing pad 500 into the polishing regions 502, 504, 506 and 508 of equal size separated by 90 degrees. In an alternative embodiment not shown, it is possible to separate the polishing regions into two sizes, such as 80 degrees, 100 degrees, 80 degrees and 100 degrees. In a further alternative embodiment, it is possible to separate the polishing regions into four different sizes, such as 70 degrees, 110 degrees, 80 degrees and 100 degrees. Furthermore, it is possible to change the order of the polishing regions. As polishing pad 500 rotates, the biased grooves sweep the wafer to improve removal rate. With this embodiment, it is advantageous for the radial feeder grooves 510, 512, 514 and 516 to have a larger cross section than the biased grooves to improve distribution of the polishing fluid.

Referring to FIG. 5A, outward bias polishing pad 550 has four polishing regions 552, 554, 556 and 558. Radial feeder grooves 560, 562, 564 and 566 separate the polishing pad 550 into the polishing regions 552, 554, 556 and 558 of equal size separated by 90 degrees. In an alternative embodiment not shown, it is possible to separate the polishing regions into two sizes, such as 80 degrees, 100 degrees, 80 degrees and 100 degrees. In a further alternative embodiment, it is possible to separate the polishing regions into four different sizes, such as 70 degrees, 80 degrees, 100 degrees and 110 degrees. Furthermore, it is possible to change the order of the polishing regions. As polishing pad 550 rotates, the biased grooves sweep the wafer to improve removal rate. With this embodiment, it is advantageous for the radial feeder grooves 560, 562, 564 and 566 to have a larger cross section than the biased grooves to improve distribution of the polishing fluid.

Figure 6A:
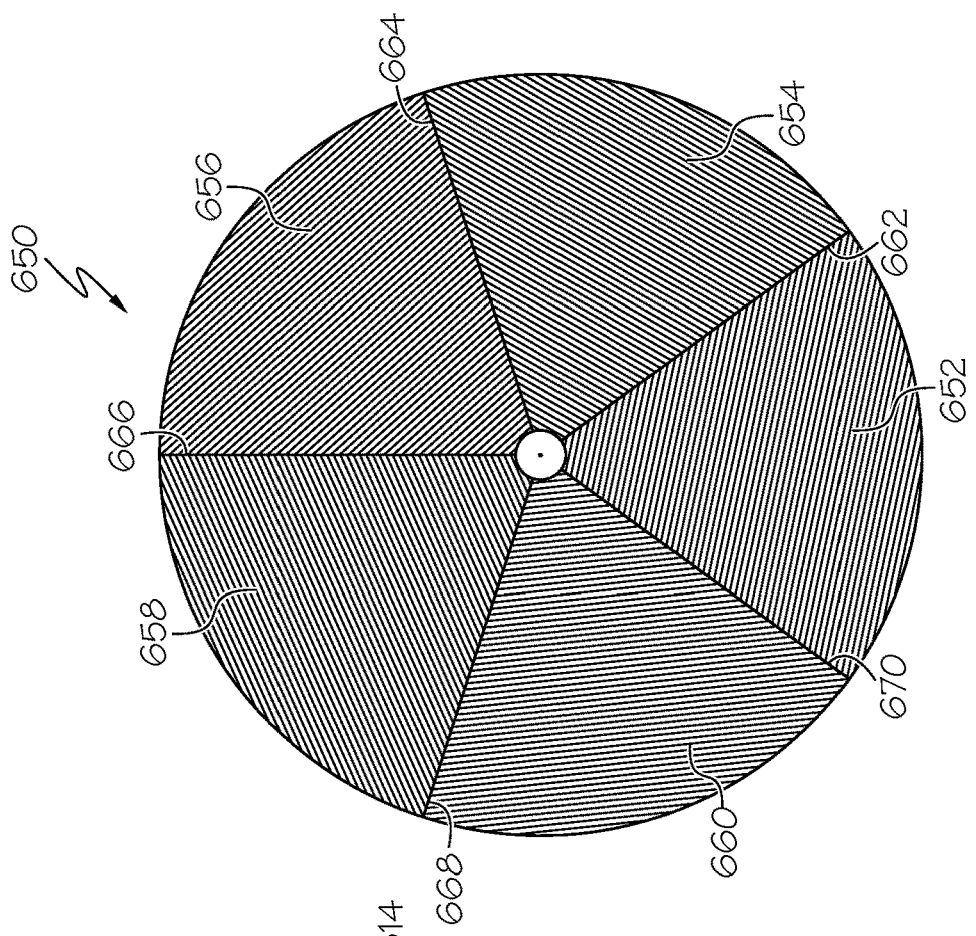
FIG. 6A is a top schematic view of an outward bias polishing pad having five polishing regions each having a series of outward biased grooves connecting adjacent radial feeder grooves.
Figure 6:
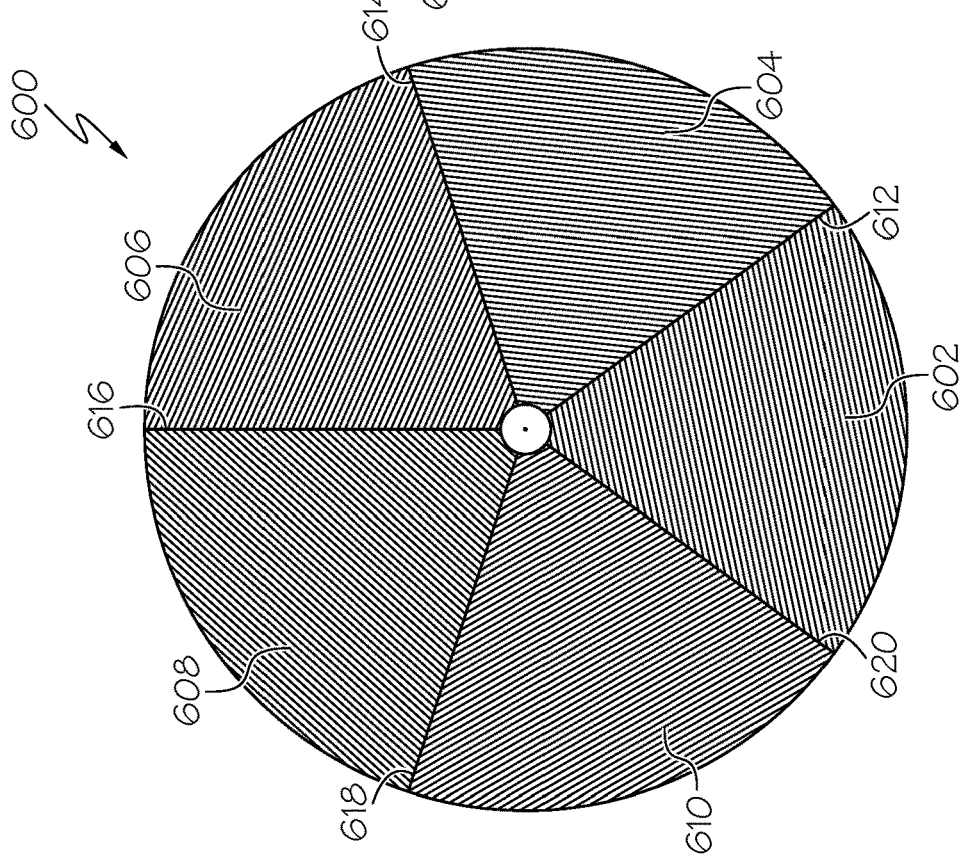
FIG. 6 is a top schematic view of an inward bias polishing pad having five polishing regions each having a series of inward biased grooves connecting adjacent radial feeder grooves.

Referring to FIG. 6, inward bias polishing pad 600 has five polishing regions 602, 604, 606, 608 and 610. Radial feeder grooves 612, 614, 616, 618 and 620 separate the polishing pad 600 into the polishing regions 602, 604, 606, 608 and 610 of equal size separated by 72 degrees. In an alternative embodiment not shown, it is possible to separate the polishing regions into two sizes, such as 60 degrees, 90 degrees, 60 degrees, 90 degrees and 60 degrees. In a further alternative embodiment, it is possible to separate the polishing regions into five different sizes, such as 52 degrees, 62 degrees, 72 degrees, 82 degrees and 92 degrees. Furthermore, it is possible to change the order of the polishing regions. As polishing pad 600 rotates, the biased grooves sweep the wafer to improve removal rate and additional radial feeder grooves facilitate polishing fluid distribution. With this embodiment, it is advantageous for the radial feeder grooves 612, 614, 616, 618 and 620 to have a larger cross section than the biased grooves to improve distribution of the polishing fluid.

Referring to FIG. 6A, outward bias polishing pad 650 has five polishing regions 652, 654, 656, 658 and 660. Radial feeder grooves 662, 664, 666, 668 and 670 separate the polishing pad 650 into the polishing regions 652, 654, 656, 658 and 660 of equal size separated by 72 degrees. In an alternative embodiment not shown, it is possible to separate the polishing regions into two sizes, such as 60 degrees, 90 degrees, 60 degrees, 90 degrees and 60 degrees. In a further alternative embodiment, it is possible to separate the polishing regions into five different sizes, such as 52 degrees, 62 degrees, 72 degrees, 82 degrees and 92 degrees. Furthermore, it is possible to change the order of the polishing regions. As polishing pad 650 rotates, the biased grooves sweep the wafer to improve removal rate and additional radial feeder grooves facilitate polishing fluid distribution. With this embodiment, it is advantageous for the radial feeder grooves 662, 664, 666, 668 and 670 to have a larger cross section than the biased grooves to improve distribution of the polishing fluid.

Figure 7A:
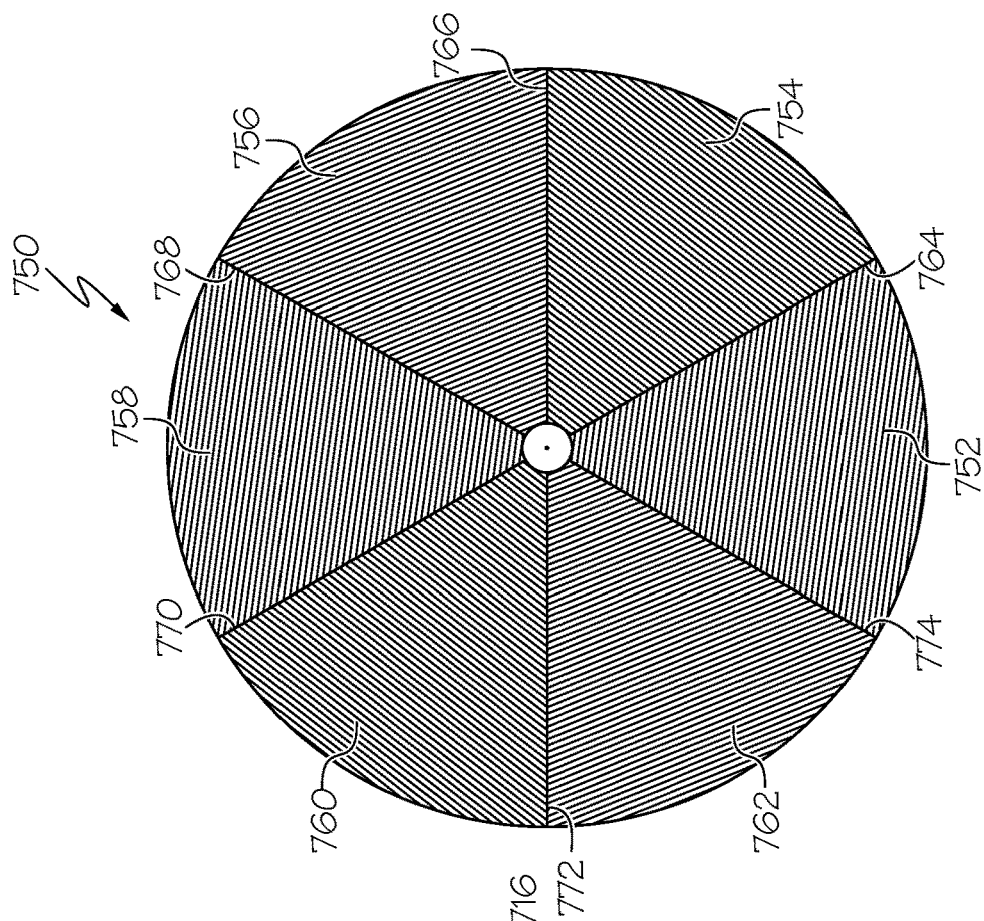
FIG. 7A is a top schematic view of an outward bias polishing pad having six polishing regions each having a series of outward biased grooves connecting adjacent radial feeder grooves.
Figure 7:
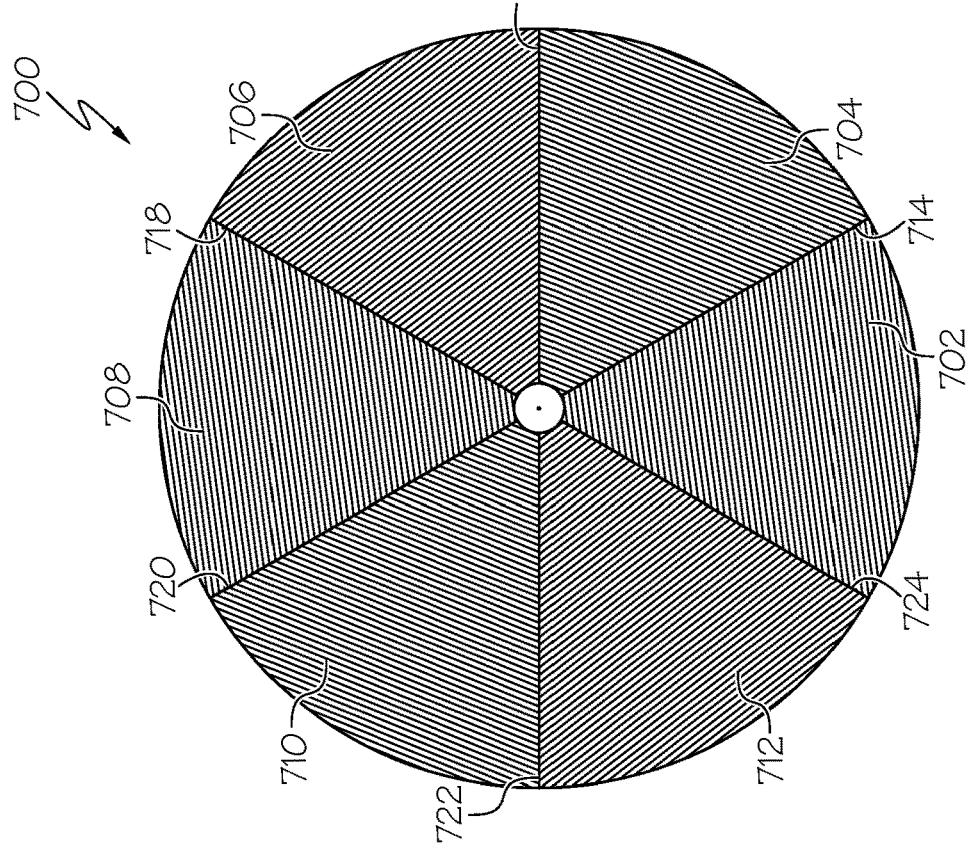
FIG. 7 is a top schematic view of an inward bias polishing pad having six polishing regions each having a series of inward biased grooves connecting adjacent radial feeder grooves.

Referring to FIG. 7, inward bias polishing pad 700 has six polishing regions 702, 704, 706, 708, 710 and 712. Radial feeder grooves 714, 716, 718, 720, 722 and 724 separate the polishing pad 700 into the polishing regions 702, 704, 706, 708, 710 and 712 of equal size separated by 60 degrees. In an alternative embodiment not shown, it is possible to separate the polishing regions into two sizes, such as 50 degrees, 70 degrees, 50 degrees, 70 degrees, 50 degrees and 70 degrees. In a further alternative embodiment, it is possible to separate the polishing regions into six different sizes, such as 30 degrees, 40 degrees, 50 degrees, 70 degrees, 80 degrees and 90 degrees. Furthermore, it is possible to change the order of the polishing regions. As polishing pad 700 rotates, the biased grooves sweep the wafer to improve removal rate and additional radial feeder grooves facilitate polishing fluid distribution. With this embodiment, it is advantageous for the radial feeder grooves 714, 716, 718, 720, 722 and 724 to have a larger cross section than the biased grooves to improve distribution of the polishing fluid.

Referring to FIG. 7A, outward bias polishing pad 750 has six polishing regions 752, 754, 756, 758, 760 and 762. Radial feeder grooves 764, 766, 768, 770, 772 and 774 separate the polishing pad 750 into the polishing regions 752, 754, 756, 758, 760 and 762 of equal size separated by 60 degrees. In an alternative embodiment not shown, it is possible to separate the polishing regions into two sizes, such as 50 degrees, 70 degrees, 50 degrees, 70 degrees, 50 degrees and 70 degrees. In a further alternative embodiment, it is possible to separate the polishing regions into six different sizes, such as 30 degrees, 40 degrees, 50 degrees, 70 degrees, 80 degrees and 90 degrees. Furthermore, it is possible to change the order of the polishing regions. As polishing pad 750 rotates, the biased grooves sweep the wafer to improve removal rate and additional radial feeder grooves facilitate polishing fluid distribution. With this embodiment, it is advantageous for the radial feeder grooves 764, 766, 768, 770, 772 and 774 to have a larger cross section than the biased grooves to improve distribution of the polishing fluid.

Referring to FIG. 1, inward bias polishing pad 10 has eight polishing regions 40, 42, 44, 46, 48, 50, 52 and 54. Radial feeder grooves 20, 22, 24, 26, 28, 30, 32 and 34 separate the polishing pad 10 into the polishing regions 40, 42, 44, 46, 48, 50, 52 and 54 of equal size separated by 45 degrees. In an alternative embodiment not shown, it is possible to separate the polishing regions into two sizes, such as 35 degrees, 55 degrees, 35 degrees, 55 degrees, 35 degrees, 55 degrees, 35 degrees and 55 degrees. In a further alternative embodiment, it is possible to separate the polishing regions into eight different sizes, such as 25 degrees, 30 degrees, 35 degrees, 40 degrees, 50 degrees, 55 degrees, 60 degrees and 65 degrees. Furthermore, it is possible to change the order of the polishing regions. As polishing pad 10 rotates, the biased grooves sweep the wafer to improve removal rate and additional radial feeder grooves facilitate polishing fluid distribution. With this embodiment, it is advantageous for the radial feeder grooves 20, 22, 24, 26, 28, 30, 32 and 34 to have a larger cross section than the biased grooves to improve distribution of the polishing fluid. Rotating the polishing pad alternates the wafer between being over one radial feeder groove and being over two radial feeder grooves.

Referring to FIG. 2, outward bias polishing pad 210 has eight polishing regions 240, 242, 244, 246, 248, 250, 252 and 254. Radial feeder grooves 220, 222, 224, 226, 228, 230, 232 and 234 separate the polishing pad 210 into the polishing regions 240, 242, 244, 246, 248, 250, 252 and 254 of equal size separated by 45 degrees. In an alternative embodiment not shown, it is possible to separate the polishing regions into two sizes, such as 35 degrees, 55 degrees, 35 degrees, 55 degrees, 35 degrees, 55 degrees, 35 degrees and 55 degrees. In a further alternative embodiment, it is possible to separate the polishing regions into eight different sizes, such as 25 degrees, 30 degrees, 35 degrees, 40 degrees, 50 degrees, 55 degrees, 60 degrees and 65 degrees. Furthermore, it is possible to change the order of the polishing regions. As polishing pad 210 rotates, the biased grooves sweep the wafer to improve removal rate and additional radial feeder grooves facilitate polishing fluid distribution. With this embodiment, it is advantageous for the radial feeder grooves 220, 222, 224, 226, 228, 230, 232 and 234 to have a larger cross section than the biased grooves to improve distribution of the polishing fluid.

Figure 8A:
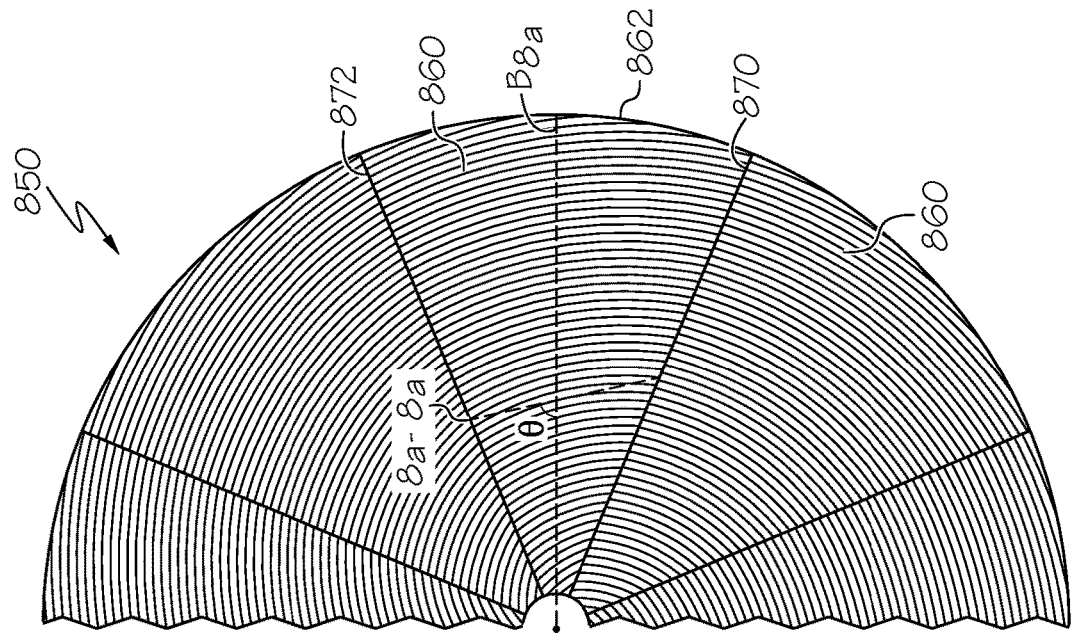
FIG. 8A is a top schematic view with one half broken away of an inward bias polishing pad having eight polishing regions each having a series of inward biased curved grooves connecting adjacent radial feeder grooves.
Figure 8:
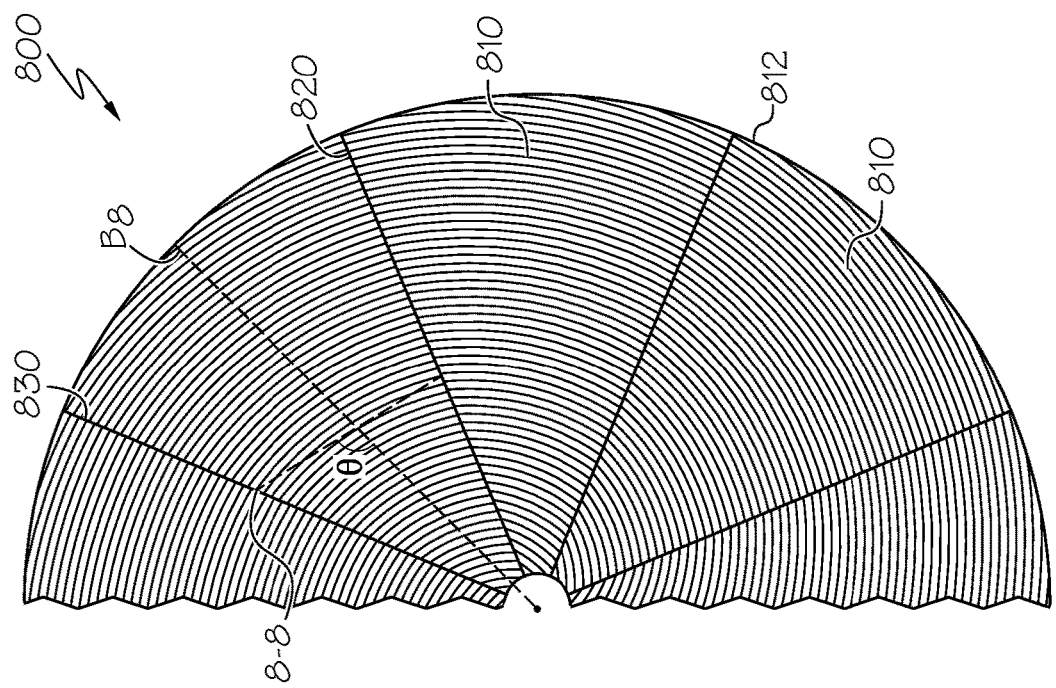
FIG. 8 is a top schematic view with one half broken away of an outward bias polishing pad having eight polishing regions each having a series of outward biased curved grooves connecting adjacent radial feeder grooves.

Referring to FIGS. 8 and 8A, curving the biased grooves 810 and 860 of polishing pads 800 and 850, respectively can facilitate uniform flow of polishing fluid over groove land areas. Polishing pads 800 and 850 have outward bias grooves 810 and 860. As the polishing pads 800 and 850 rotate, polishing fluid flows out the grooves 810 and 860 toward the outer edge 812 and 862. In grooves 810 and 860, the outward slope of the grooves diminish as it travels outward, this slows outward velocity and facilitates polishing fluid wetting the land areas toward the end of the grooves 810 and 860 during both clockwise and counterclockwise rotation.

For these configurations and for purposes of the specification, the bias angle θ equals the average angle of the curved biased grooves in relation to the bisect line represented by a dashed line. One method for measuring bias angle as seen in FIG. 8 is to draw an imaginary line 8-8 that connects adjacent radial feeder grooves 820 and 830 along a single curved biased groove, then measure the angle of intersection (θ) or bias angle with dashed bisect line $B_8$. Similarly, for FIG. 8A, imaginary line 8a-8a connects adjacent radial feeder grooves 870 and 872 along a single curved bias groove, then measuring the angle of intersection with dashed bisect line $B_{8a}$ equals the bias angle, θ. It is important that at least a majority of each curved bias segment have either an inward or outward angle. Advantageously, a majority of the bias grooves have the same bias. This is because having an inward biased groove portion with an outward biased groove portion will tend to cancel each other out with respect to removal rate. Advantageously, all the bias segments have either an inward or outward bias.

Figure 9:
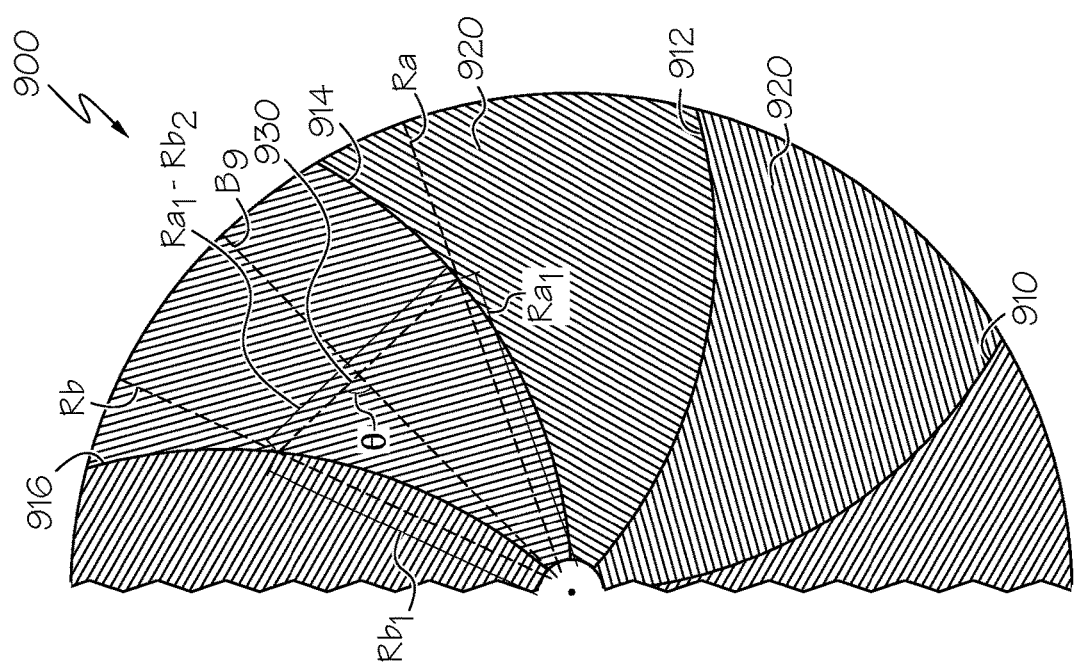
FIG. 9 is a top schematic view with one half broken away of an outward bias polishing pad having eight polishing regions each having a series of outward biased grooves connecting adjacent curved radial feeder grooves.

Referring to FIG. 9, polishing pad 900 has curved radial feeder grooves 910, 912, 914 and 916. The feeder grooves 910, 912, 914 and 916 curve counter counterclockwise to improve fluid flow for clockwise rotation of polishing pad 900. This shape accelerates outward flow of the polishing fluid to improve polishing fluid distribution to outer bias grooves 920 during clockwise rotation and decelerates outward flow to decrease polishing fluid distribution to outer bias grooves 920 during counterclockwise rotation. Alternatively, the radial feeder grooves could curve in a clockwise direction (not shown) for the opposite impact. This shape decelerates outward flow of the polishing fluid to improve polishing fluid distribution to outer bias grooves 920 during counterclockwise rotation and accelerates outward flow to decrease polishing fluid distribution to outer bias grooves 920 during clockwise rotation.

Measuring bias angle for FIG. 9 having curved radial feeder grooves 914 and 916, requires drawing of dashed radial lines Ra and Rb with imaginary bisect line $B_9$ that bisects dashed radial lines Ra and Rb. This illustrates the bias angle θ for outward bias groove 930 that intersects bisect line $B_9$. Chords $Ra_1$ and $Rb_1$ have equal length and are parallel radial lines Ra and Rb, respectively. A dashed line $Ra_1$-$Rb_1$ connects ends of chords $Ra_1$ and $Rb_1$ and intersects with bisect line $B_9$ at bias groove 930. The bias angle for groove 930 is the angle between bisect line $B_9$ and groove 930 or θ. This embodiment has a constant θ along each bias groove and throughout the entire polishing region.

Figure 10:
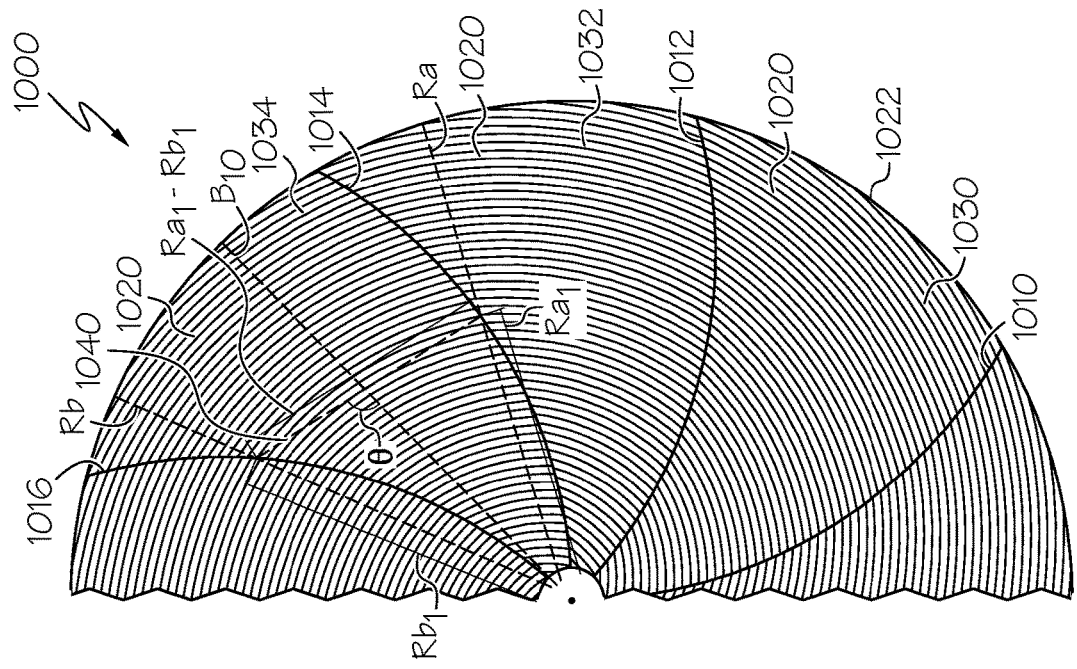
FIG. 10 is a top schematic view with one half broken away of an outward bias polishing pad eight polishing regions each having a series of outward biased curved grooves connecting adjacent curved radial feeder grooves.

Referring to FIG. 10, polishing pad 1000 includes curved radial feeder grooves 1010, 1012, 1014 and 1016 combined with outward biased curved grooves 1020. In particular, this groove pattern includes curved radial feeder grooves 1010, 1012, 1014 and 1016 to fine tune or adjust polishing fluid near the outer edge 1022 of the polishing pad 1000. Furthermore, outward biased curved grooves 1020 serve to balance polishing fluid flow onto land area within polishing regions 1030, 1032 and 1034.

Measuring bias angle for FIG. 10 having curved radial feeder grooves 1014 and 1016, requires drawing of dashed radial lines Ra and Rb with imaginary bisect line $B_{10}$ that bisects dashed radial lines Ra and Rb. This illustrates the bias angle θ for outward bias groove 1040 that intersects bisect line $B_{10}$. Chords $Ra_1$ and $Rb_1$ have equal length and are parallel radial lines Ra and Rb, respectively. A dashed line $Ra_1$-$Rb_1$ connects ends of chords $Ra_1$ and $Rb_1$ and intersects with bisect line $B_9$ at bias groove 1040. The bias angle for groove 1040 is the angle between bisect line $B_{10}$ and a line that connects the ends of groove 1040 or θ. This embodiment has a θ that increases with each bias groove spaced farther away from the polishing pad 1000.

Figure 11A:
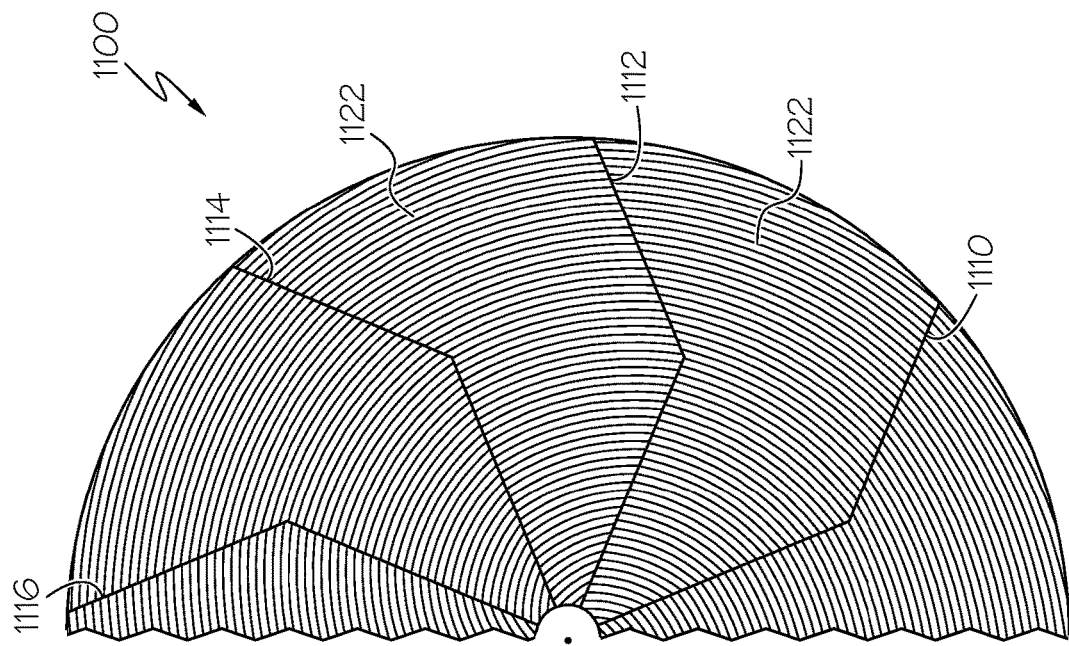
FIG. 11A is a top schematic view with one half broken away of an inward bias polishing pad having eight polishing regions each having a series of inward biased curved grooves connecting adjacent stepped radial feeder grooves.
Figure 11:
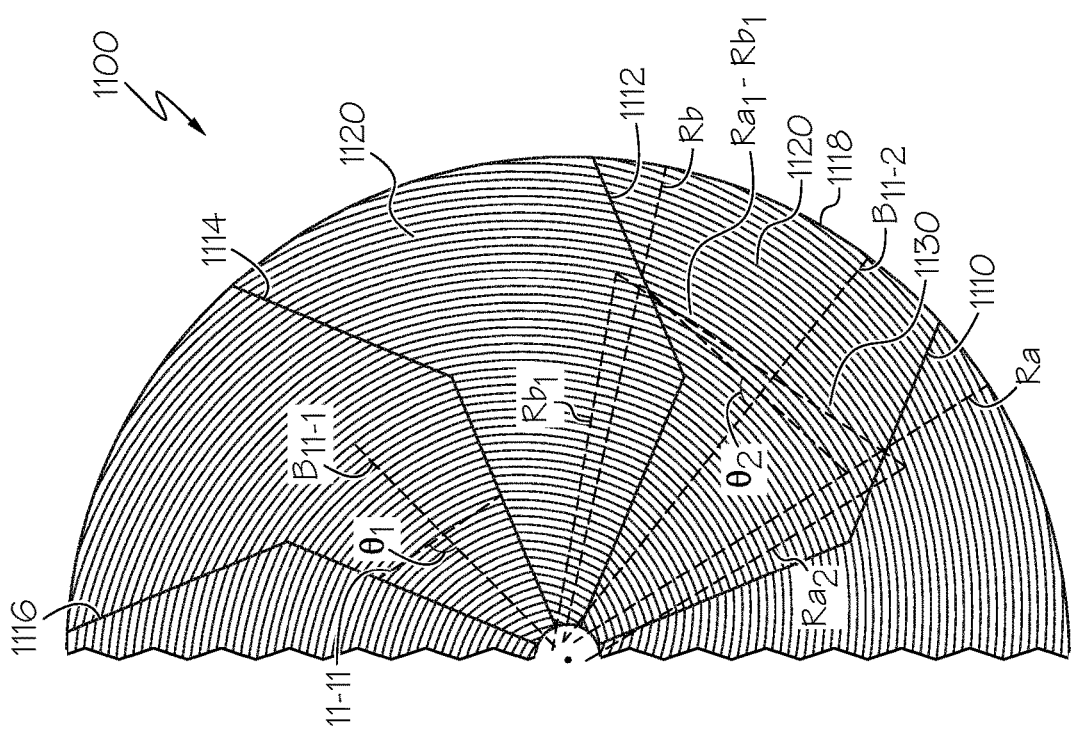
FIG. 11 is a top schematic view with one half broken away of an outward bias polishing pad having eight polishing regions each having a series of outward biased curved grooves connecting adjacent stepped radial feeder grooves.
Figure 11B:
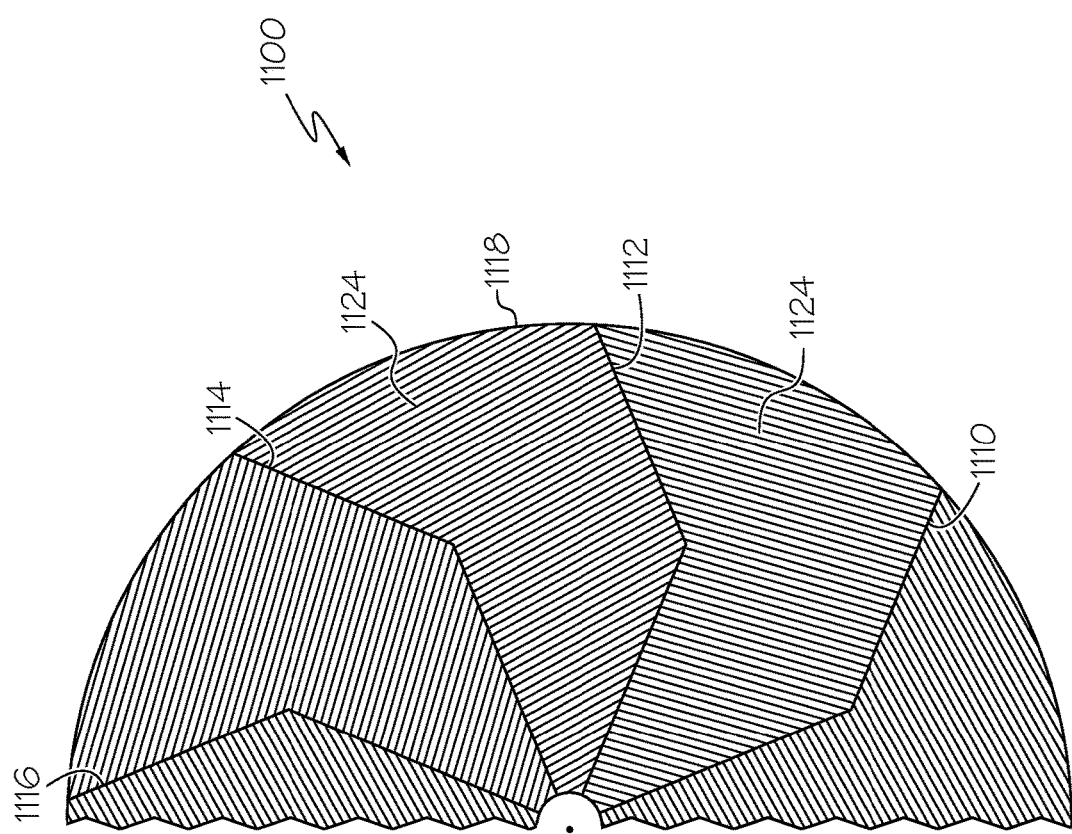
FIG. 11B is a top schematic view with one half broken away of an inward bias polishing pad having eight polishing regions each having a series of inward biased curved grooves connecting adjacent stepped radial feeder grooves.

Referring to FIGS. 11, 11A and 11B, polishing pad 1100 include stepped radial feeder grooves 1110, 1112, 1114 and 1116. This shape decelerates outward flow of the polishing fluid to improve polishing fluid distribution to outer bias grooves 1120, 1122 and 1124 during clockwise rotation and accelerates outward flow to decrease polishing fluid distribution to outer bias grooves 1120, 1122 and 1124 during counterclockwise rotation. Alternatively, the radial feeder grooves could curve in a clockwise direction (not shown) for the opposite impact. This shape decelerates outward flow of the polishing fluid to improve polishing fluid distribution to outer bias grooves 1120, 1122 and 1124 during counterclockwise rotation and decelerates outward flow to decrease polishing fluid distribution to outer bias grooves 1120, 1122 and 1124 during clockwise rotation. Outward curved radial bias grooves 1120, inward radial bias grooves 1122 and inward parallel radial bias grooves 1124 all serve to adjust, residence time of the polishing fluid under the wafer and fine tune polishing profile. In addition, it is possible to adjust the edge profile by adjusting platen or wafer rotation speed. For example, increasing platen or wafer speed can change center fast polishing into a flat profile. This effect becomes much more pronounced when the wafer does not oscillate between the center and the edge of the polishing pad.

Referring to FIG. 11, imaginary line 11-11 connects a single bias groove. The angle between imaginary line 11-11 and radial feeder grooves 1114 and 1116 at the bisect line $B_{11\text{-}1}$ represents $\theta_1$ or the bias angle for the first portion of the polishing region. This portion of the polishing region has a bias angle that decreases for each biased grooved spaced from the center of the polishing pad.

The second region requires the drawing of radial lines Ra and Rb and $B_{11\text{-}2}$ that bisects the radial lines Ra and Rb. Radial chords $Ra_1$ and $Rb_1$ have equal length and are parallel radial lines Ra and Rb, respectively Dashed line $B_{11\text{-}2}$ represents the bisect of these radial chords. Imaginary line $Ra_1$-$Rb_1$ connects $Ra_1$ and $Rb_1$ and passes through the intersection of bias groove 1130 and bisect line $B_{11\text{-}2}$. The intersection of a line that connects the ends of bias groove 1130 with bisect line $B_{11\text{-}2}$ represents the bias angle or $\theta_2$. This portion of the polishing region also has a bias angle that decreases for each biased grooved spaced from the center of the polishing pad.

Figure 12A:
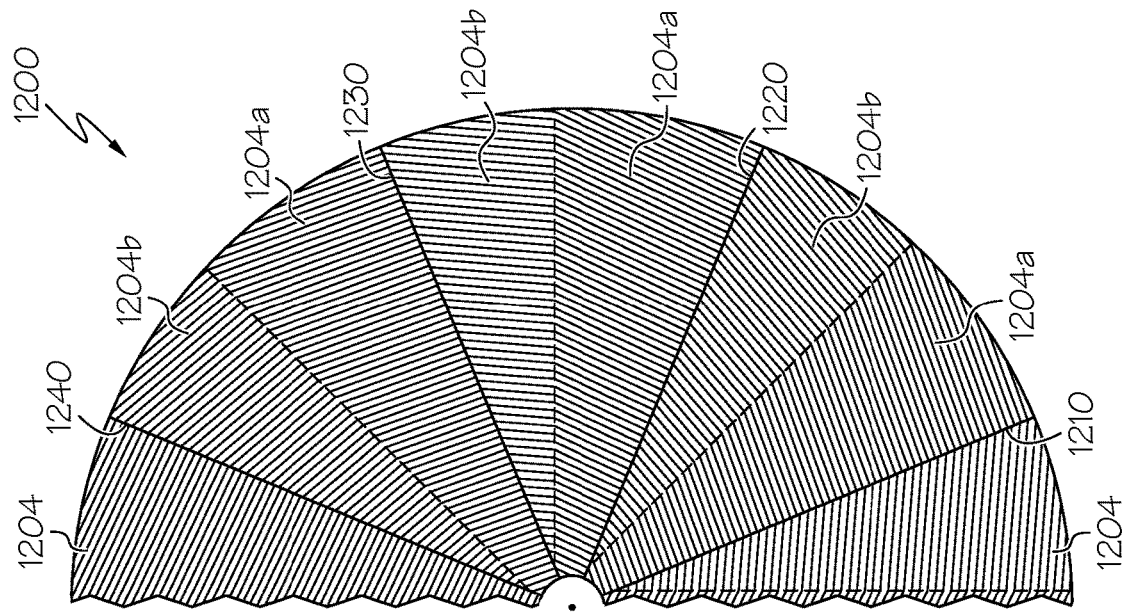
FIG. 12A is a top schematic view with one half broken away of an outward bias polishing pad having eight polishing regions each having a series of outward biased stepped grooves connecting adjacent radial feeder grooves.
Figure 12:
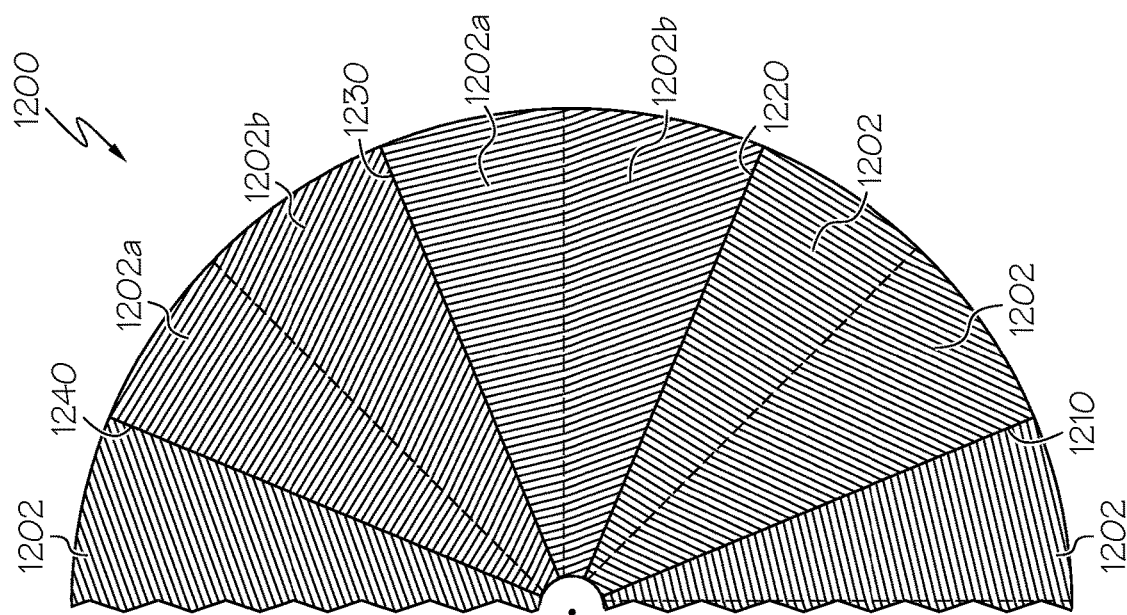
FIG. 12 is a top schematic view with one half broken away of an inward bias polishing pad having eight polishing regions each having a series of inward biased stepped grooves connecting adjacent radial feeder grooves.

Referring to FIGS. 12 and 12A, polishing pad 1200 may contain a series of stepped bias grooves 1202 and 1204, respectively, connecting radial feeder grooves 1210, 1220, 1230 and 1240. The stepped bias grooves 1202 and 1204 have segments 1202a and 1202b and 1204 having segments 1204a and 1204b, each separated by a dashed line for purposes of illustration. FIG. 12 has inward biased stepped grooves 1202, divided into equal parts of groove segment 1202a and 1202b. In this configuration, slurry first travels with a shallow bias through groove segment 1202a then at an increased rate through groove segment 1202b having a steeper slope. FIG. 12A has biased stepped grooves 1204, divided into unequal parts of groove segment 1204a and 1204b. In this configuration, slurry first travels with a steep bias through groove segment 1204a then at a decreased rate through groove segment 1204b having a shallower slope. It is possible to use the segment spacing and slope to adjust wafer profile and edge profile.

Figure 13:
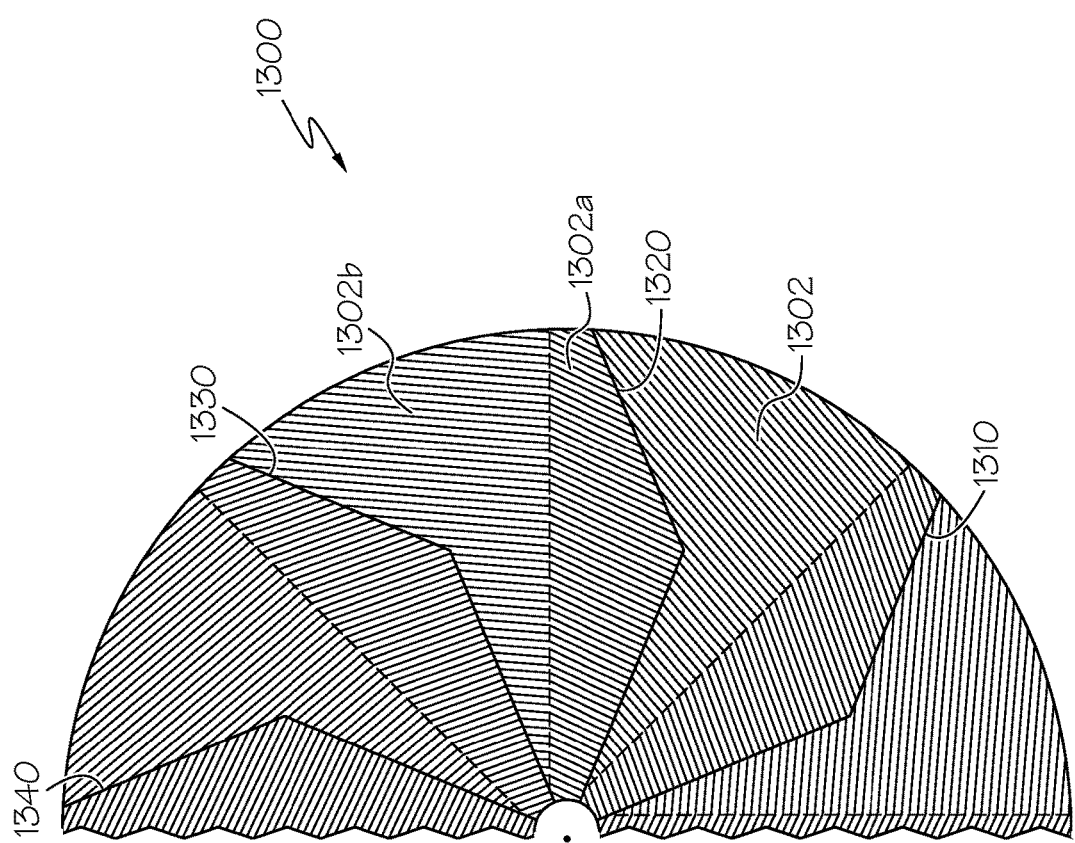
FIG. 13 is a top schematic view with one half broken away of an outward bias polishing pad having eight polishing regions each having a series of outward biased stepped grooves connecting adjacent stepped radial feeder grooves.

Referring to FIG. 13, polishing pad 1300 includes outward biased stepped grooves 1302 interconnecting adjacent stepped radial feeder grooves 1310, 1320 1330 and 1340. The stepped bias grooves 1302 have segments 1302a and 1202b, each separated by a dashed line for purposes of illustration. The location of the step and slope at the step for both the radial feeder groove and the stepped bias grooves impacts polishing removal rate, wafer profile and edge profile.

Figure 14A:
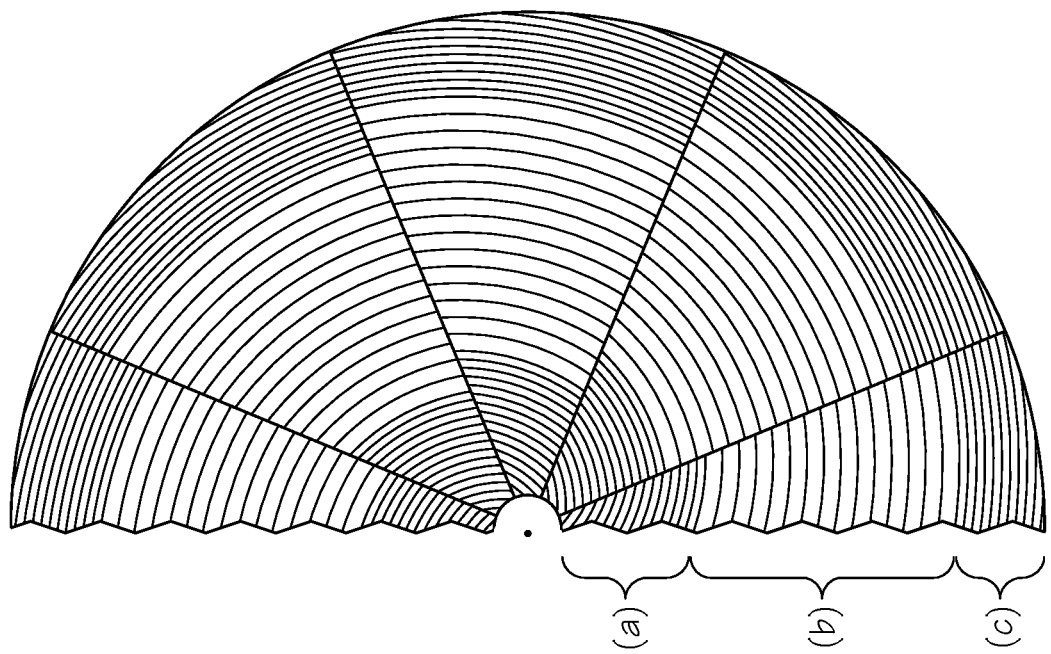
FIG. 14A is a top schematic view with one half broken away of an outward bias polishing pad having eight polishing regions each having a series increased pitch outward bias curved grooves between two series of normal pitched outward bias curved grooves all connecting adjacent radial feeder grooves.
Figure 14:
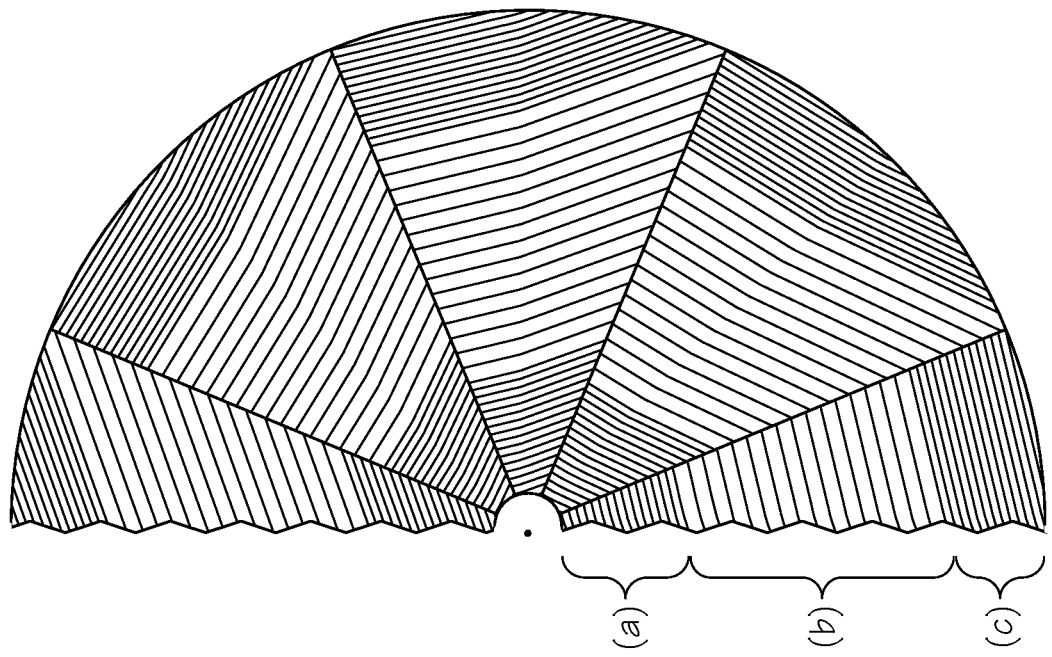
FIG. 14 is a top schematic view with one half broken away of an inward bias polishing pad having eight polishing regions each having a series increased pitch inward bias stepped grooves between two series of normal pitched inward bias stepped grooves all connecting adjacent radial feeder grooves.
Figure 14C:
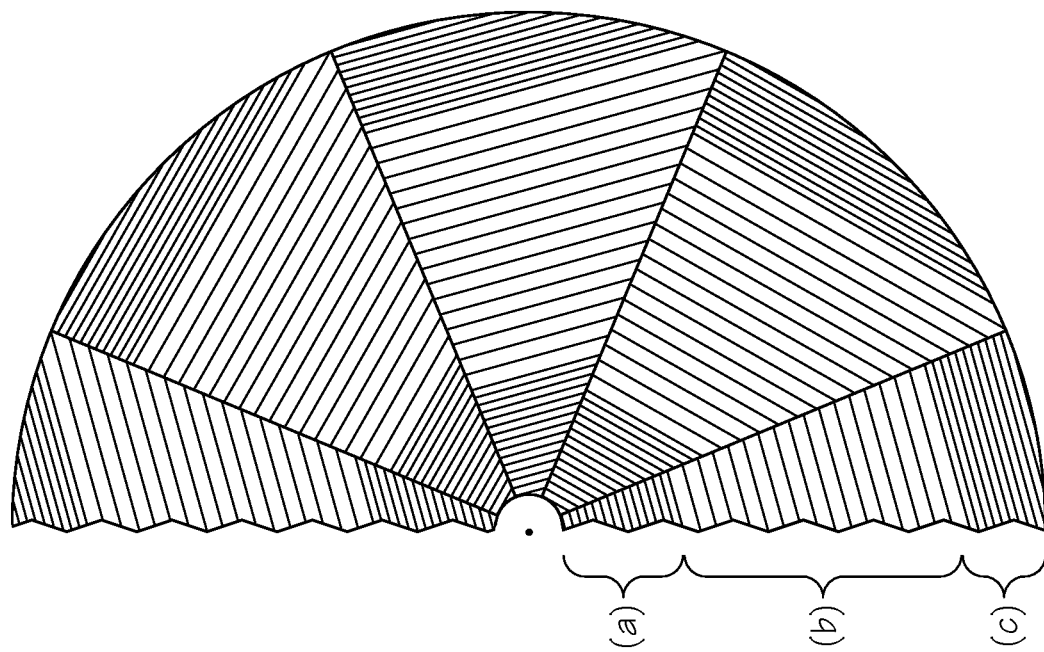
FIG. 14C is a top schematic view with one half broken away of an inward bias polishing pad having eight polishing regions each having a series increased pitch inward bias grooves between two series of normal pitched inward bias grooves all connecting adjacent radial feeder grooves.
Figure 14B:
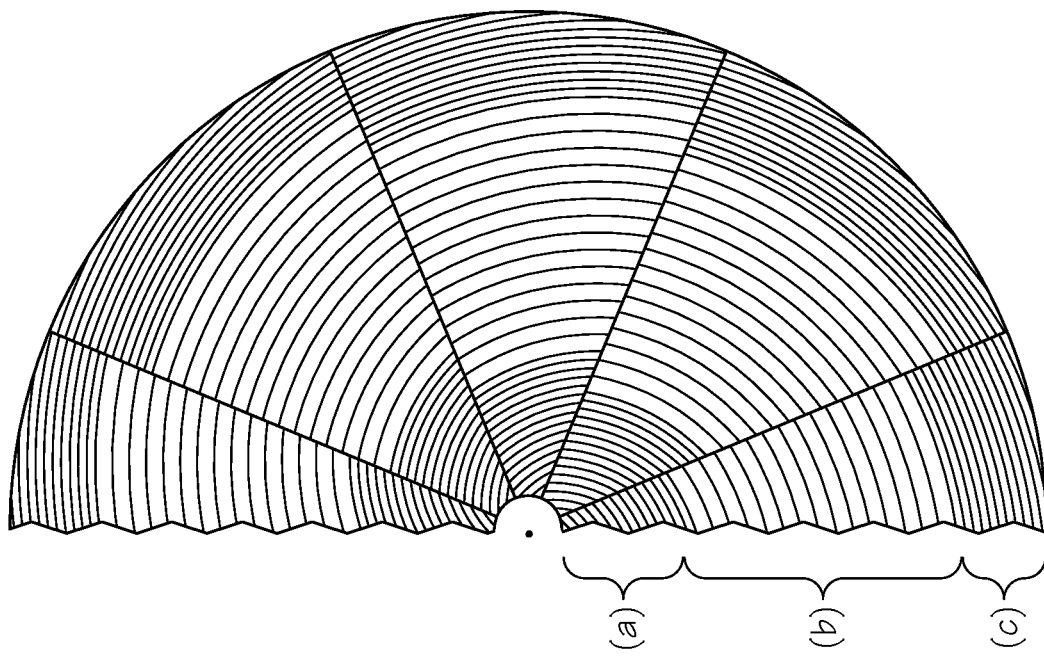
FIG. 14B is a top schematic view with one half broken away of an inward bias polishing pad having eight polishing regions each having a series increased pitch inward bias curved grooves between two series of normal pitched inward bias curved grooves all connecting adjacent radial feeder grooves.

Referring to FIGS. 14, 14A, 14B and 14C, polishing pads can include two or more groove regions with different pitches or different cross sectional areas. FIGS. 14, 14A, 14C all include inward spacing region having three regions as follows: (a) grooves at a first normal pitch, (b) grooves at an increased pitch and (c) grooves with a pitch equal to region (a). This groove spacing is effective for eliminating center fast wafer profiles. Fine tuning of wafer profile is possible by adjusting the width of each groove region and the density of grooves within each groove region. Adjusting groove spacing has particular impact upon improving wafer edge profile. As seen in FIG. 14, the biased grooves may be parallel linear grooves, parallel curved grooves or stepped grooves. These grooves may have equal or unequal spacing.

Figure 15A:
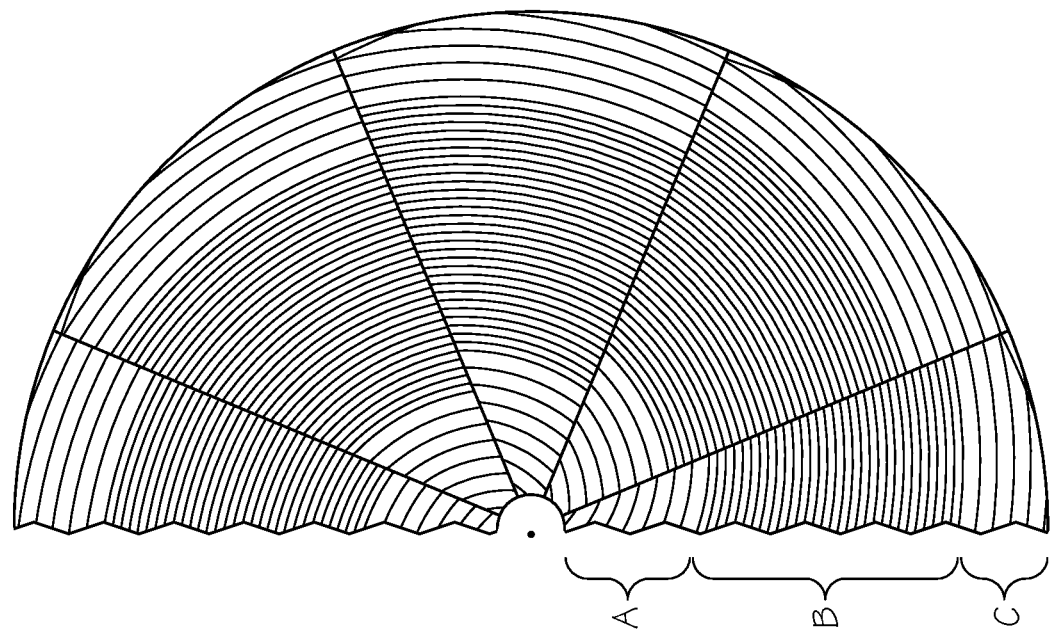
FIG. 15A is a top schematic view with one half broken away of an outward bias polishing pad having eight polishing regions each having a series normal pitch outward bias curved grooves between two series of increased pitched outward bias curved grooves all connecting adjacent radial feeder grooves.
Figure 15:
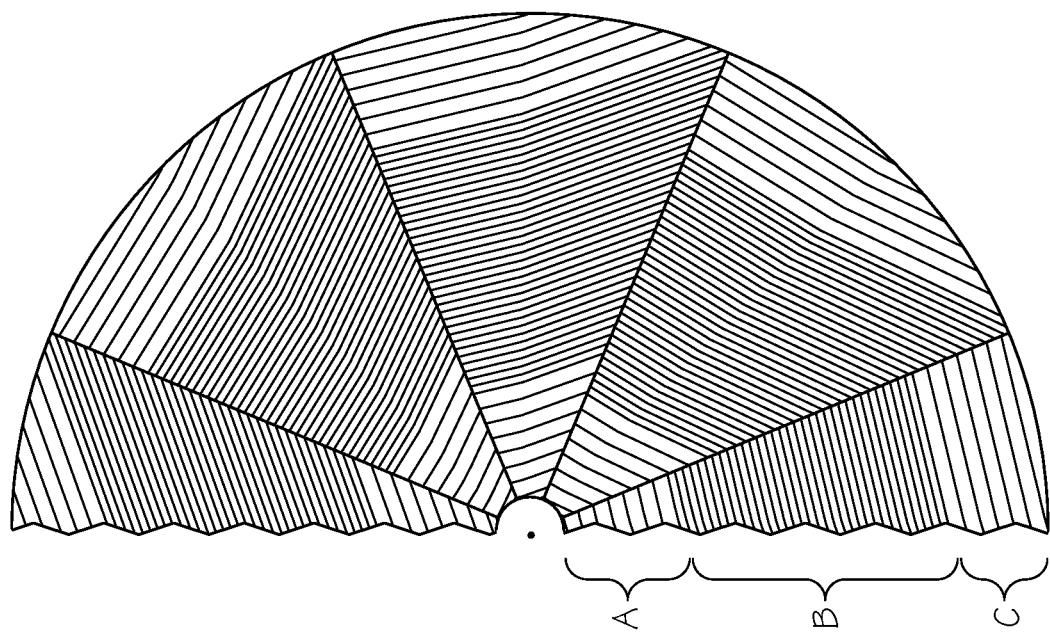
FIG. 15 is a top schematic view with one half broken away of an inward bias polishing pad having eight polishing regions each having a series normal pitch inward bias stepped grooves between two series of increased pitch inward bias stepped grooves all connecting adjacent radial feeder grooves.
Figure 15C:
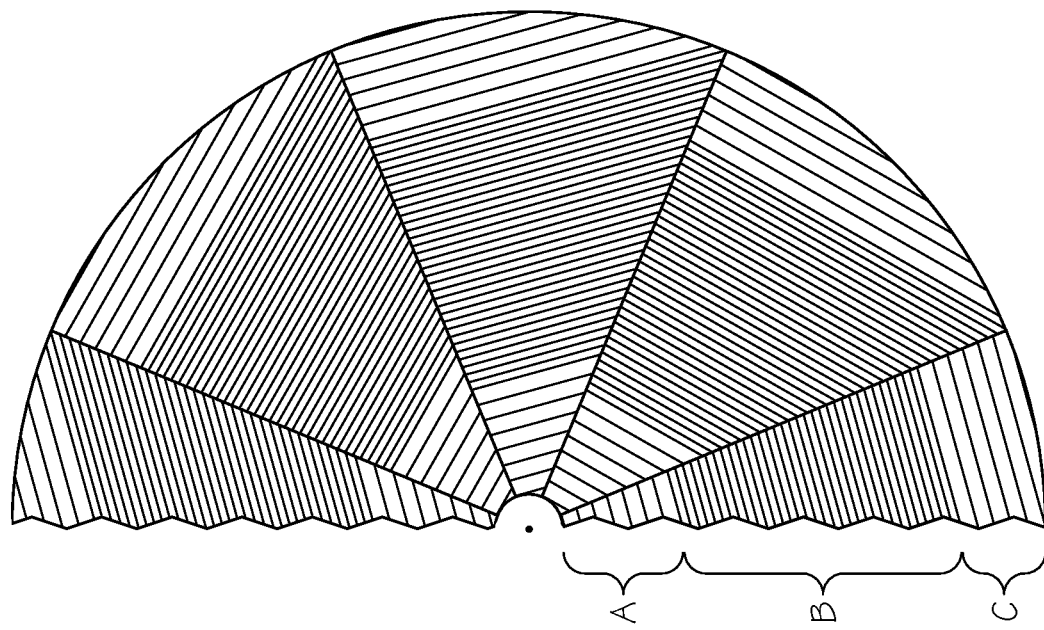
FIG. 15C is a top schematic view with one half broken away of an inward bias polishing pad having eight polishing regions each having a series normal pitch inward bias grooves between two series of increased pitch inward bias grooves all connecting adjacent radial feeder grooves.
Figure 15B:
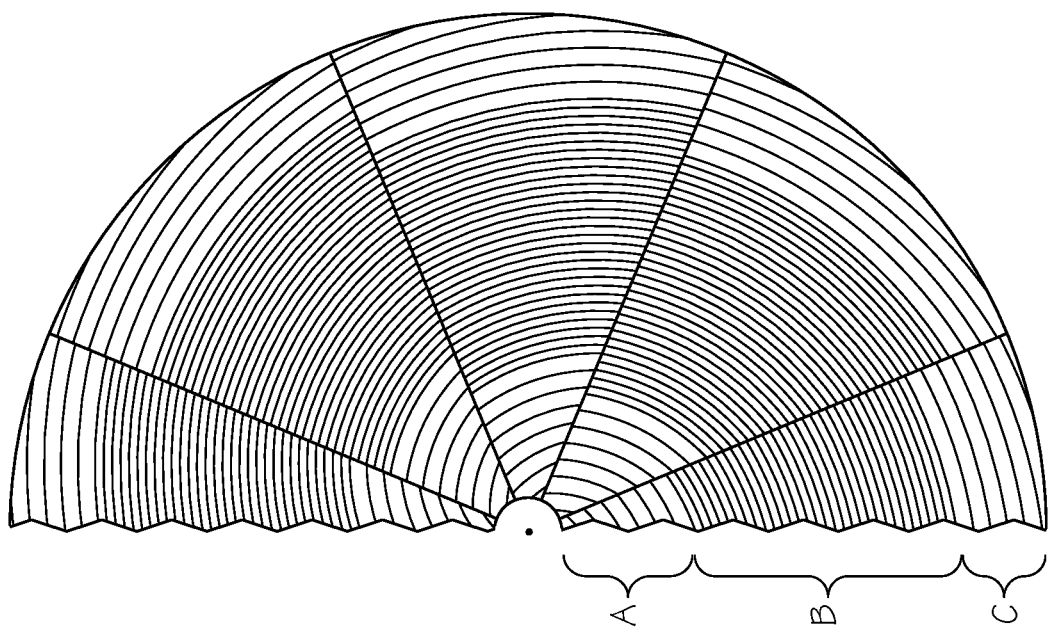
FIG. 15B is a top schematic view with one half broken away of an inward bias polishing pad having eight polishing regions each having a series normal pitch inward bias curved grooves between two series of increased pitch inward bias curved grooves all connecting adjacent radial feeder grooves.

Referring to FIGS. 15, 15A, 15B and 15C, polishing pads can include two or more groove regions with different pitches or different cross sectional areas. FIGS. 15, 15A, 15B and 15C all include inward spacing region having three regions as follows: (A) grooves at a first increased pitch, (B) grooves at a normal pitch and (C) grooves with a pitch equal to region (A). This groove spacing is effective for eliminating center slow wafer profiles. Fine tuning of wafer profile is possible by adjusting the width of each groove region and the density of grooves within each groove region. Adjusting groove spacing has particular impact upon improving wafer edge profile. As seen in FIG. 15, the biased grooves may be parallel linear grooves, parallel curved grooves or stepped grooves. These grooves may have equal or unequal spacing.

We claim:

1. A method for polishing or planarizing a wafer of at least one of semiconductor, optical and magnetic substrates, the method comprising the following:

rotating a polishing pad, the rotating polishing pad having a polishing layer having a polymeric matrix and a thickness, the polishing layer including a center, an outer edge and a radius extending from the center to the outer edge of the polishing pad; radial feeder grooves in the polishing layer separating the polishing layer into polishing regions, the polishing regions being circular sectors defined by two adjacent radial feeder grooves, the polishing regions having a bias for adjusting residence time under the wafer, the bias having a bias angle $\theta$ between a bisect line bisecting polishing regions and biased grooves connecting adjacent feeder grooves, the bias angle $\theta$ being either an inward bias angle $\theta$ sloped inward toward the center of the polishing pad or an outward bias angle $\theta$ sloped outward toward the outer edge of the polishing pad, a majority of the biased grooves sweeping the wafer in the same direction under the wafer, the radial feeder grooves extending at least from a location adjacent the center to a location adjacent the outer edge; and each polishing region including a series of biased grooves connecting a pair of adjacent radial feeder grooves, the majority of the biased grooves having either an inward bias toward the center of the polishing pad or an outward bias toward the outer edge of the polishing pad, both the inward and outward biased grooves moving polishing fluid toward the outer edge of the polishing pad and either toward the wafer or away from the wafer depending upon inward bias or outward bias and the direction of rotation of the polishing pad;

distributing polishing fluid onto the rotating polishing pad and into the radial feeder grooves and the series of biased grooves; and pressing and rotating the wafer against the rotating polishing pad for multiple rotations of the polishing pad to adjust polishing by selecting either i) to increase residence time of the polishing fluid with outward flow of the polishing fluid in the series of biased in the circular sectors under the wafer for the series of biased grooves inward bias toward the center of the rotating polishing pad during counterclockwise rotation of the polishing pad, or ii) to increase residence time of the polishing fluid with outward flow of the polishing fluid in the series of biased in the circular sectors under the wafer for the series of biased grooves outward bias toward the outer edge of the rotating polishing pad during clockwise rotation of the polishing pad and wherein non-alignment of bias grooves between adjacent polishing regions facilitates polishing fluid flow down the radial feeder grooves to improve slurry distribution.

2. The method of claim 1 wherein the wafer remains positioned at a location along the radius from the center of the polishing pad closer to the outer edge of the polishing pad then the center of the polishing pad to increase removal rate of at least one component of the wafer.

3. The method of claim 1 wherein rotating the polishing pad sends used polishing fluid through a portion of the series of biased grooves over the outer edge of the polishing pad to allow flow of new polishing fluid under the wafer.

4. The method of claim 1 wherein the series of biased grooves represent parallel grooves that increase residence time of the polishing fluid under the wafer.

5. A method for polishing or planarizing a wafer of at least one of semiconductor, optical and magnetic substrates, the method comprising the following:

rotating a polishing pad, the rotating polishing pad having a polishing layer having a polymeric matrix and a thickness, the polishing layer including a center, an outer edge and a radius extending from the center to the outer edge of the polishing pad; radial feeder grooves in the polishing layer separating the polishing layer into polishing regions, the polishing regions being circular sectors defined by two adjacent radial feeder grooves, the polishing regions having a bias for adjusting residence time under the wafer, the bias having a bias angle $\theta$ between a bisect line bisecting polishing regions and sloped grooves connecting adjacent feeder grooves, the bias angle $\theta$ being either an inward bias angle $\theta$ sloped inward toward the center of the polishing pad or an outward bias angle $\theta$ sloped outward toward the outer edge of the polishing pad, a majority of the biased grooves sweeping the wafer in the same direction, a bisect line bisecting the polishing regions, the radial feeder grooves extending at least from a location adjacent the center to a location adjacent the outer edge; and each polishing region including a series of biased grooves connecting a pair of adjacent radial feeder grooves, the majority of the biased grooves having either an inward bias toward the center of the polishing pad at an angle of 20° to 85° from the bisect line or an outward bias toward the outer edge of the polishing pad at an angle of 95° to 160° from the bisect line, both the inward and outward biased grooves moving polishing fluid toward the outer edge of the polishing pad and either toward the wafer or away from the wafer depending upon inward bias or outward bias and the direction of rotation of the polishing pad;

distributing polishing fluid onto the rotating polishing pad and into the radial feeder grooves and the series of biased grooves; and pressing and rotating the wafer against the rotating polishing pad for multiple rotations of the polishing pad to adjust polishing by selecting either i) to increase residence time of the polishing fluid with outward flow of the polishing fluid in the series of biased in the circular sectors under the wafer for the series of biased grooves inward bias toward the center of the rotating polishing pad during counterclockwise rotation of the polishing pad, or ii) to increase residence time of the polishing fluid with outward flow of the polishing fluid in the series of biased in the circular sectors under the wafer for the series of biased grooves outward bias toward the outer edge of the rotating polishing pad during clockwise rotation of the polishing pad and wherein non-alignment of bias grooves between adjacent regions facilitates polishing fluid flow down the radial feeder grooves to improve slurry distribution.

6. The method of claim 5 wherein the wafer remains positioned at a location along the radius from the center of the polishing pad closer to the outer edge of the polishing pad then the center of the polishing pad to increase removal rate of at least one component of the wafer.

7. The method of claim 5 wherein rotating the polishing pad sends used polishing fluid through a portion of the series of biased grooves over the outer edge of the polishing pad to allow flow of new polishing fluid under the wafer.

8. The method of claim 5 wherein the series of biased grooves represent parallel grooves that increase residence time of the polishing fluid under the wafer.

* * * * *